United States Patent
Park et al.

(10) Patent No.: US 11,411,192 B2
(45) Date of Patent: Aug. 9, 2022

(54) DEVICES AND SENSORS AND ELECTRONIC DEVICES

(71) Applicant: Samsung Electronics Co., Ltd., Suwon-si (KR)

(72) Inventors: Kyung Bae Park, Hwaseong-si (KR); Naotoshi Suganuma, Yokohama (JP); Chul Joon Heo, Busan (KR); Sung Jun Park, Yongin-si (KR); Sung Young Yun, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/984,510

(22) Filed: Aug. 4, 2020

(65) Prior Publication Data

US 2021/0066628 A1    Mar. 4, 2021

(30) Foreign Application Priority Data

Sep. 2, 2019   (KR) ........................ 10-2019-0108398

(51) Int. Cl.
    *H01L 51/44*    (2006.01)
    *H01L 51/42*    (2006.01)

(52) U.S. Cl.
    CPC ........ *H01L 51/441* (2013.01); *H01L 51/4273* (2013.01); *H01L 51/44* (2013.01); *H01L 51/4253* (2013.01); *Y02E 10/549* (2013.01)

(58) Field of Classification Search
    CPC ... H01L 51/441; H01L 51/4273; H01L 51/44; H01L 51/4253
    See application file for complete search history.

(56) References Cited

U.S. PATENT DOCUMENTS

| | | | |
|---|---|---|---|
| 6,451,415 B1 * | 9/2002 | Forrest | B82Y 10/00 428/212 |
| 9,960,353 B2 | 5/2018 | Liang et al. | |
| 10,115,918 B2 | 10/2018 | Qi et al. | |
| 2002/0113545 A1 * | 8/2002 | Adachi | H01L 51/5088 313/503 |
| 2006/0027802 A1 * | 2/2006 | Forrest | H01L 51/0021 257/40 |

(Continued)

FOREIGN PATENT DOCUMENTS

| | | |
|---|---|---|
| CN | 108258079 A | 7/2018 |
| EP | 3709369 A1 | 9/2020 |
| KR | 10-1969659 B1 | 4/2019 |

OTHER PUBLICATIONS

Extended European Search Report dated Jan. 19, 2021 for corresponding European Application No. 20191529.5.

*Primary Examiner* — Golam Mowla
(74) *Attorney, Agent, or Firm* — Harness, Dickey & Pierce, P.L.C.

(57) ABSTRACT

A device includes a first electrode and a second electrode, an active layer between the first electrode and the second electrode and a plurality of auxiliary layers between the first electrode and the active layer. The auxiliary layers include first and second auxiliary layers, the first auxiliary layer proximate to the active layer, the second auxiliary layer proximate to the second electrode. An energy level of the active layer, an energy level of the first auxiliary layer, an energy level of the second auxiliary layer, and a work function of the first electrode become deeper sequentially or shallower sequentially.

22 Claims, 15 Drawing Sheets

(56) References Cited

U.S. PATENT DOCUMENTS

| | | | |
|---|---|---|---|
| 2012/0060907 A1* | 3/2012 | Schoenfeld | H01L 27/302 |
| | | | 257/E31.124 |
| 2012/0060910 A1* | 3/2012 | Schoenfeld | B82Y 10/00 |
| | | | 438/96 |
| 2016/0093821 A1 | 3/2016 | Archer | |
| 2018/0254424 A1 | 9/2018 | Jia et al. | |
| 2019/0214591 A1 | 7/2019 | Park et al. | |

* cited by examiner

DEVICES AND SENSORS AND ELECTRONIC DEVICES

CROSS-REFERENCE TO RELATED APPLICATION

This application claims priority to and the benefit of, under 35 U.S.C. § 119, Korean Patent Application No. 10-2019-0108398 filed in the Korean Intellectual Property Office on Sep. 2, 2019, the entire contents of which are incorporated herein by reference.

BACKGROUND

1. Field

Devices, sensors, and electronic devices are disclosed.

2. Description of the Related Art

A photoelectric conversion device may receive incident light and convert the received incident light into an electrical signal. A photoelectric conversion device may include a photodiode and a phototransistor, and may be applied to (e.g., included in) a sensor or a photodetector.

Sensors may have higher resolutions and thus may have smaller pixel sizes. A sensitivity of a silicon photodiode in an organic sensor may be deteriorated based on reduced pixel size of the sensor and reduced absorption area of the silicon photodiode. Accordingly, organic materials that are capable of replacing silicon in photodiodes of organic sensors have been researched.

An organic material has a high extinction coefficient and is configured to selectively absorb light in a particular wavelength spectrum of light depending on a molecular structure of the organic material, and thus may simultaneously replace a photodiode and a color filter of a sensor and resultantly improve sensitivity of the sensor and contribute to high integration of the sensor.

However, since such organic materials exhibit different characteristics from those of silicon due to high binding energy and a recombination behavior associated with such organic materials, the characteristics of the organic material are difficult to precisely predict, and thus properties of a photoelectric conversion device may not be easily controlled.

SUMMARY

Some example embodiments provide one or more devices capable of improving charge extraction characteristics by reducing residual charge carriers.

Some example embodiments provide a sensor including one or more of the devices.

Some example embodiments provide electronic devices including one or more devices or one or more sensors.

According to some example embodiments, a device may include a first electrode and a second electrode, an active layer between the first electrode and the second electrode, and a plurality of auxiliary layers between the first electrode and the active layer. The plurality of auxiliary layers may include a first auxiliary layer and a second auxiliary layer, the first auxiliary layer proximate to the active layer in relation to the second auxiliary layer, the second auxiliary layer proximate to the first electrode in relation to the first auxiliary layer. An energy level of the active layer, an energy level of the first auxiliary layer, an energy level of the second auxiliary layer, and a work function of the first electrode may become deeper sequentially or shallower sequentially, such that a magnitude of the energy level of the first auxiliary layer is between a magnitude of the energy level of the active layer and a magnitude of the energy level of the second auxiliary layer, and the magnitude of the energy level of the second auxiliary layer is between the magnitude of the energy level of the first auxiliary layer and a magnitude of the work function of the first electrode. Energy diagrams of the active layer, the first auxiliary layer, the second auxiliary layer, and the first electrode may satisfy Relationship Equation 1:

$$|\Delta\phi_1 - \Delta\phi_2| \leq 0.1 \text{ eV} \qquad \text{[Relationship Equation 1]}$$

wherein, in Relationship Equation 1, $\Delta\phi_1$ is an energy barrier between the active layer and the first auxiliary layer, and $\Delta\phi_2$ is an energy barrier between the second auxiliary layer and the first electrode.

The first auxiliary layer may be in contact with the active layer, and the second auxiliary layer may be in contact with the first electrode.

Energy diagrams of the active layer, the first auxiliary layer, the second auxiliary layer, and the first electrode may satisfy Relationship Equations 2 and 3:

$$|\Delta\phi_1 - \Delta\phi_3| \leq 0.1 \text{ eV} \qquad \text{[Relationship Equation 2]}$$

$$|\Delta\phi_3 - \Delta\phi_2| \leq 0.1 \text{ eV} \qquad \text{[Relationship Equation 3]}$$

wherein, in Relationship Equations 2 and 3, $\Delta\phi_1$ is the energy barrier between the active layer and the first auxiliary layer, $\Delta\phi_2$ is the energy barrier between the second auxiliary layer and the first electrode, and $\Delta\phi_3$ is an energy barrier between the first auxiliary layer and the second auxiliary layer.

Each of $\Delta\phi_1$, $\Delta\phi_2$, and $\Delta\phi_3$ may be less than or equal to about 0.5 eV.

The energy diagrams of the active layer, the first auxiliary layer, the second auxiliary layer, and the first electrode may satisfy Relationship Equations 1E, 2E, and 3E.

$$0 < |\Delta\phi_1 - \Delta\phi_2| \leq 0.05 \text{ eV} \qquad \text{[Relationship Equation 1E]}$$

$$0 < |\Delta\phi_1 - \Delta\phi_3| \leq 0.05 \text{ eV} \qquad \text{[Relationship Equation 2E]}$$

$$0 < |\Delta\phi_3 - \Delta\phi_2| \leq 0.05 \text{ eV} \qquad \text{[Relationship Equation 3E]}$$

wherein, in Relationship Equation 1E to 3E, $\Delta\phi_1$ is the energy barrier between the active layer and the first auxiliary layer, $\Delta\phi_2$ is the energy barrier between the second auxiliary layer and the first electrode, and $\Delta\phi_3$ is the energy barrier between the first auxiliary layer and the second auxiliary layer.

The plurality of auxiliary layers further may include a third auxiliary layer between the first auxiliary layer and the second auxiliary layer. The energy level of the active layer, the energy level of the first auxiliary layer, an energy level of the third auxiliary layer, the energy level of the second auxiliary layer, and the work function of the first electrode become deeper sequentially or shallower sequentially, such that the magnitude of the energy level of the first auxiliary layer is between the magnitude of the energy level of the active layer and a magnitude of the energy level of the third auxiliary layer, the magnitude of the energy level of the third auxiliary layer is between the magnitude of the energy level of the first auxiliary layer and the magnitude of the energy level of the second auxiliary layer, and the magnitude of the energy level of the second auxiliary layer is between the magnitude of the energy level of the third auxiliary layer and the magnitude of the work function of the first electrode, and energy diagrams of the active layer, the first auxiliary layer, the third auxiliary layer, the second auxiliary layer, and the first electrode may satisfy Relationship Equations 4 and 5:

$|\Delta\phi_2-\Delta\phi_4|\leq 0.1$ eV [Relationship Equation 4]

$|\Delta\phi_1-\Delta\phi_5|\leq 0.1$ eV [Relationship Equation 5]

wherein, in Relationship Equations 4 and 5, $\Delta\phi_1$ is the energy barrier between the active layer and the first auxiliary layer, $\Delta\phi_2$ is the energy barrier between the second auxiliary layer and the first electrode, $\Delta\phi_4$ is an energy barrier between the third auxiliary layer and the second auxiliary layer, and $\Delta\phi_5$ is an energy barrier between the first auxiliary layer and the third auxiliary layer.

The energy levels of the active layer, the first auxiliary layer, the third auxiliary layer, the second auxiliary layer, and the first electrode may satisfy Relationship Equation 6.

$|\Delta\phi_4-\Delta\phi_5|\leq 0.1$ eV [Relationship Equation 6]

wherein, in Relationship Equation 6, $\Delta\phi_4$ the energy barrier between the third auxiliary layer and the second auxiliary layer, and $\Delta\phi_5$ is the energy barrier between the first auxiliary layer and the third auxiliary layer.

$\Delta\phi_1$, $\Delta\phi_2$, $\Delta\phi_3$, $\Delta\phi_4$ and $\Delta\phi_5$ are each less than or equal to about 0.5 eV.

The first electrode may be an anode and the second electrode may be a cathode, and each energy barrier may be a difference between HOMO energy levels.

The device may include an electron buffer layer between the second electrode and the active layer.

The electron buffer layer may include a lanthanide element, calcium (Ca), potassium (K), aluminum (Al), or an alloy thereof.

The electron buffer layer may include a first electron buffer layer and a second electron buffer layer, the first electron buffer layer proximate to the active layer in relation to the second electron buffer layer, the second electron buffer layer proximate to the second electrode in relation to the first electron buffer layer. A LUMO energy level of the active layer, a LUMO energy level of the first electron buffer layer, a LUMO energy level of the second electron buffer layer, and a work function of the second electrode become deeper sequentially, such that a magnitude of the LUMO energy level of the first electron buffer layer is between a magnitude of the LUMO energy level of the active layer and a magnitude of the LUMO energy level of the second electron buffer layer, and the magnitude of the LUMO energy level of the second electron buffer layer is between the magnitude of the LUMO energy level of the first electron buffer layer and a magnitude of the work function of the second electrode. Energy diagrams of the active layer, the first electron buffer layer, the second electron buffer layer, and the second electrode satisfy Relationship Equation 7:

$|\Delta\phi_6-\Delta\phi_7|\leq 0.1$ eV [Relationship Equation 7]

wherein, in Relationship Equation 7, $\Delta\phi_6$ is an energy barrier between the active layer and the first electron buffer layer, and $\Delta\phi_7$ is an energy barrier between the second electron buffer layer and the second electrode, wherein the energy barriers of $\Delta\phi_6$ and $\Delta\phi_7$ are differences between LUMO energy levels.

The energy diagrams of the active layer, the first electron buffer layer, the second electron buffer layer and the second electrode may satisfy Relationship Equations 8 and 9:

$|\Delta\phi_6-\Delta\phi_8|\leq 0.1$ eV [Relationship Equation 8]

$|\Delta\phi_7-\Delta\phi_8|\leq 0.1$ eV [Relationship Equation 9]

wherein in Relationship Equations 8 and 9, $\Delta\phi_6$ is the energy barrier between the active layer and the first electron buffer layer, $\Delta\phi_7$ is the energy barrier between the second electron buffer layer and the second electrode, and $\Delta\phi_8$ is an energy barrier between the first electron buffer layer and the second electron buffer layer, wherein the energy barriers of $\Delta\phi_6$, $\Delta\phi_7$, $\Delta\phi_8$ are differences between LUMO energy levels.

The $\Delta\phi_6$, $\Delta\phi_7$, $\Delta\phi_8$ may each be less than or equal to about 0.5 eV.

The first electrode may be a cathode, the second electrode may be an anode, and the energy barrier may be a difference between LUMO energy levels.

The device may include a hole buffer layer between the second electrode and the active layer.

The first auxiliary layer and the second auxiliary layer may each have a thickness of less than or equal to about 10 nm.

The first auxiliary layer and the second auxiliary layer may each include an organic material.

The active layer may be a photoelectric conversion layer configured to absorb light in at least part of a wavelength spectrum and convert the absorbed light into an electrical signal.

A sensor may include the device.

An electronic device may include the device.

Residual charge carriers may be reduced to improve charge extraction characteristics.

DETAILED DESCRIPTION

Figure 1:
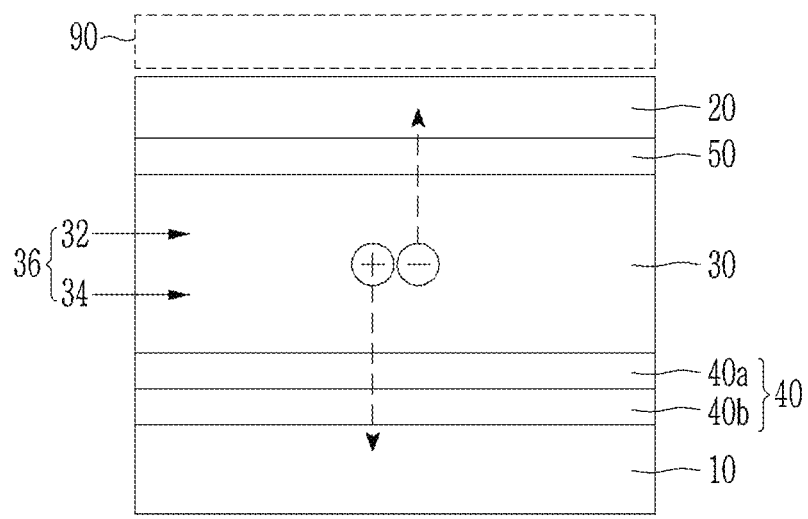
FIG. 1 is a cross-sectional view showing a device according to some example embodiments.

Example embodiments will hereinafter be described in detail, and may be easily performed by those who have common knowledge in the related art. However, this disclosure may be embodied in many different forms and is not to be construed as limited to the example embodiments set forth herein.

In the drawings, the thickness of layers, films, panels, regions, etc., are exaggerated for clarity.

It will be understood that when an element such as a layer, film, region, or substrate is referred to as being "on" another element, it may be directly on the other element or intervening elements may also be present. In contrast, when an element is referred to as being "directly on" another element, there are no intervening elements present. It will further be understood that when an element is referred to as being "on" another element, it may be above or beneath the other element.

It will be understood that elements and/or properties thereof may be recited herein as being "the same" or "equal" as other elements, and it will be further understood that elements and/or properties thereof recited herein as being "the same" as or "equal" to other elements may be "the same" as or "equal" to or "substantially the same" as or "substantially equal" to the other elements and/or properties thereof. Elements and/or properties thereof that are "substantially the same" as or "substantially equal" to other elements and/or properties thereof will be understood to include elements and/or properties thereof that are the same as or equal to the other elements and/or properties thereof within manufacturing tolerances and/or material tolerances. Elements and/or properties thereof that are the same or substantially the same as other elements and/or properties thereof may be structurally the same or substantially the same, functionally the same or substantially the same, and/or compositionally the same or substantially the same.

It will be understood that elements and/or properties thereof (e.g., structures, properties of one or more elements, lengths, distances, energy levels, energy barriers, or the like) described herein as being the "substantially" the same encompasses elements and/or properties thereof (e.g., structures, properties of one or more elements, lengths, distances, energy levels, energy barriers, or the like) that are the same within manufacturing tolerances and/or material tolerances and/or elements and/or properties thereof (e.g., structures, properties of one or more elements, lengths, distances, energy levels, energy barriers, or the like) that have a relative difference in magnitude that is equal to or less than 10%. Further, regardless of whether elements and/or properties thereof (e.g., structures, properties of one or more elements, lengths, distances, energy levels, energy barriers, or the like) are modified as "substantially," it will be understood that these elements and/or properties thereof (e.g., structures, properties of one or more elements, lengths, distances, energy levels, energy barriers, or the like) should be construed as including a manufacturing or operational tolerance (e.g., ±10%) around the stated elements and/or properties thereof (e.g., structures, properties of one or more elements, lengths, distances, energy levels, energy barriers, or the like).

When the terms "about" or "substantially" are used in this specification in connection with a numerical value, it is intended that the associated numerical value include a tolerance of ±10% around the stated numerical value. When ranges are specified, the range includes all values therebetween such as increments of 0.1%.

Where elements, properties, or the like are described herein to have a "small" or "very small" difference between each other, it will be understood that a variation between the magnitudes of said elements and/or properties may be equal to or less than 10% of the magnitudes of the elements, properties, or the like being described.

As used herein, when a definition is not otherwise provided, "substituted" refers to replacement of hydrogen of a compound by a substituent selected from a halogen atom, a hydroxy group, an alkoxy group, a nitro group, a cyano group, an amino group, an azido group, an amidino group, a hydrazino group, a hydrazono group, a carbonyl group, a carbamyl group, a thiol group, an ester group, a carboxyl group or a salt thereof, a sulfonic acid group or a salt thereof, a phosphoric acid or a salt thereof, a silyl group, a C1 to C20 alkyl group, a C2 to C20 alkenyl group, a C2 to C20 alkynyl group, a C6 to C30 aryl group, a C7 to C30 arylalkyl group, a C1 to C30 alkoxy group, a C1 to C20 heteroalkyl group, a C3 to C20 heteroaryl group, a C3 to C20 heteroarylalkyl group, a C3 to C30 cycloalkyl group, a C3 to C15 cycloalkenyl group, a C6 to C15 cycloalkynyl group, a C3 to C30 heterocycloalkyl group, or a combination thereof.

As used herein, when a definition is not otherwise provided, "hetero" refers to one including 1 to 4 heteroatoms selected from N, O, S, Se, Te, Si, and P.

As used herein, "combination" refers to a mixture and two or more stacking structures.

As used herein, the energy level is the highest occupied molecular orbital (HOMO) energy level or the lowest unoccupied molecular orbital (LUMO) energy level.

As used herein, the work function or energy level is expressed as an absolute value from the vacuum level (e.g., as an absolute magnitude). In addition, the work function or energy level (e.g., the magnitude thereof) is referred to be deep, high, or large, it may have a large absolute value based on "0 eV" of the vacuum level while when the work function work function or energy level (e.g., the magnitude thereof)

is referred to be shallow, low, or small, it may have a small absolute value based on "0 eV" of the vacuum level.

As used herein, the work function and energy level are measured by photoelectron spectroscopy such as ultraviolet photoelectron spectroscopy (UPS) or AC-3 equipment (Riken Keiki Co. Ltd.). In particular, the work function and energy level may be obtained by measuring a photoelectric work function of thin films with a thickness of about 20 nm to about 30 nm using the AC-3 equipment and by calculating the emission energy due to the photoelectron effect for the irradiated energy by the following relationship:

[Relationship]

$$E = h \cdot c / \lambda$$

(h: plank's constant, c: light velocity, and λ: wavelength).

Hereinafter, a device according to some example embodiments is described.

The device may include, in some example embodiments, a pair of electrodes and an active layer between the pair of electrodes, and the active layer may include, in some example embodiments, an opto-electronic material. The opto-electronic material may include, in some example embodiments, a material that receives light and exhibits an electric characteristics and/or a material that receives an electric field and emits light, but is not limited thereto. The device may be for example a photoelectric conversion device, a light emitting device, a solar cell, or a photo-sensor, but is not limited thereto.

The device may be, in some example embodiments, an organic device including at least one organic material, and may be an organic diode including at least one organic material. The organic device may be for example an organic photoelectric conversion device, an organic light emitting diode, an organic solar cell, or an organic photo-sensor, but is not limited thereto.

Herein, the photoelectric conversion device is described as an example of the device.

FIG. 1 is a cross-sectional view showing a device according to some example embodiments.

Referring to FIG. 1, a device 100 according to some example embodiments includes an anode 10, a cathode 20, an active layer 30, an auxiliary layer 40, and an electron buffer layer 50. As described herein, the anode 10 and cathode 20 may each be referred to as one of a first electrode or a second electrode, where the first electrode may be one of the anode 10 or the cathode 20 or the second electrode may be the other of the anode 10 or the cathode 20.

The substrate (not shown), e.g., the semiconductor substrate 110 shown in at least FIGS. 11, 13-14, and 16, may be disposed at the side of the anode 10 or the cathode 20. The substrate may be for example made of (e.g., may at least partially comprise) an inorganic material such as glass, an organic material such as polycarbonate, polymethylmethacrylate, polyethyleneterephthalate, polyethylenenaphthalate, polyamide, polyethersulfone, or a combination thereof, or a silicon wafer. The substrate may be omitted.

The anode 10 and the cathode 20 face each other.

At least one of anode 10 or cathode 20 may be a transparent electrode. The transparent electrode may have a high transmittance of greater than or equal to about 80%. The transparent electrode may include, in some example embodiments, at least one of an oxide conductor, a carbon conductor, or a metal thin film. The oxide conductor may be for example one or more selected from indium tin oxide (ITO), indium zinc oxide (IZO), zinc tin oxide (ZTO), aluminum tin oxide (ATO), and aluminum zinc oxide (AZO). The carbon conductor may be one or more selected from graphene and carbon nanostructure. The metal thin film may be a very thin film including aluminum, magnesium silver, gold, an alloy thereof, or a combination thereof.

One of the anode 10 or the cathode 20 may be a reflective electrode. The reflective electrode may have for example a low transmittance of less than about 10% or a high reflectance of greater than or equal to about 5%. The reflective electrode may include a reflective conductor such as a metal and may include, for example aluminum (Al), silver (Ag), gold (Au), or an alloy thereof.

In some example embodiments, the anode 10 and the cathode 20 may each be a transparent electrode.

In some example embodiments, the anode 10 may be a transparent electrode and the cathode 20 may be a reflective electrode.

In some example embodiments, the anode 10 may be a reflective electrode and the cathode 20 may be a transparent electrode.

As shown in FIG. 1, the active layer 30 may be disposed between the anode 10 and the cathode 20.

The active layer 30 is a photoelectric conversion layer configured to absorb light in at least part of a wavelength spectrum (e.g., some or all of the visible wavelength spectrum, some or all of the infrared wavelength spectrum, some or all of the near-infrared wavelength spectrum, some or all of the ultraviolet wavelength spectrum, any combination thereof, or the like) and convert the absorbed light into an electrical signal. The photoelectric conversion layer may be configured to convert, in some example embodiments, a portion of light in a green wavelength spectrum (hereinafter referred to as "green light"), light in a blue wavelength spectrum (hereinafter referred to as "blue light"), light in a red wavelength spectrum (hereinafter referred to as "red light"), light in an infrared wavelength spectrum (hereinafter referred to as "infrared light"), and/or light in an ultraviolet wavelength spectrum (hereinafter referred to as "ultraviolet light") into an electrical signal.

In some example embodiments, the active layer 30 may be configured to selectively absorb any one of blue light, green light, red light, infrared light, or ultraviolet light. Herein, the selective absorption of one selected from the blue light, green light, red light, infrared light, or ultraviolet light means that a peak absorption wavelength ($\lambda_{max}$) of a light-absorption spectrum may be in one of less than about 380 nm, greater than or equal to about 380 nm and less than about 500 nm, about 500 nm to about 600 nm, greater than about 600 nm and less than or equal to about 700 nm, or greater than about 700 nm and less than or equal to about 3000 nm, and a light-absorption spectrum in the corresponding wavelength region is significantly higher than those in the other wavelength spectrums.

The active layer 30 may include at least one p-type semiconductor 32 and at least one n-type semiconductor 34 which form a pn junction 36 and may produce excitons by receiving light from outside and then separate the produced excitons into holes and electrons.

The p-type semiconductor 32 and the n-type semiconductor 34 may be independently light-absorbing materials, and for example at least one of the p-type semiconductor 32 or the n-type semiconductor 34 may be an organic light-absorbing material. In some example embodiments, at least one of the p-type semiconductor 32 or the n-type semiconductor 34 may be a wavelength-selective light-absorbing material configured to selectively absorb light in a particular (or, alternatively, predetermined) wavelength spectrum, and for example at least one of the p-type semiconductor 32 or the n-type semiconductor 34 may be a wavelength-selective organic light-absorbing material. A peak absorption wavelength ($\lambda_{max}$) of the p-type semiconductor 32 and the n-type semiconductor 34 may be in the same wavelength spectrum or in a different wavelength spectrum.

In some example embodiments, the p-type semiconductor 32 may be an organic material having a core structure including an electron donating moiety, a pi conjugation linking group, and an electron accepting moiety.

The p-type semiconductor 32 may be for example represented by Chemical Formula 1, but is not limited thereto.

EDG-HA-EAG    [Chemical Formula 1]

In Chemical Formula 1,

HA is a pi conjugation linking group and may be a C2 to C30 heterocyclic group having at least one of O, S, Se, Te, or Si, EDG is an electron donating moiety and may be an electron-donating group, and EAG is an electron accepting moiety and may be an electron accepting group.

In some example embodiments, the p-type semiconductor 32 represented by Chemical Formula 1 may be for example represented by Chemical Formula 1A.

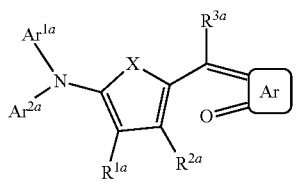

[Chemical Formula 1A]

In Chemical Formula 1A,

X may be O, S, Se, Te, SO, $SO_2$, or $SiR^aR^b$,

Ar may be a substituted or unsubstituted C6 to C30 arylene group, a substituted or unsubstituted C3 to C30 heterocyclic group, or a fused ring of the foregoing two or more, $Ar^{1a}$ and $Ar^{2a}$ may independently be a substituted or unsubstituted C6 to C30 aryl group or a substituted or unsubstituted C3 to C30 heteroaryl group, $Ar^{1a}$ and $Ar^{2a}$ may independently be present or may be linked with each other to form a fused ring, and $R^{1a}$ to $R^{3a}$, $R^a$, and $R^b$ may independently be hydrogen, deuterium, a substituted or unsubstituted C1 to C30 alkyl group, a substituted or unsubstituted C6 to C30 aryl group, a substituted or unsubstituted C3 to C30 heteroaryl group, a substituted or unsubstituted C1 to C6 alkoxy group, a halogen, or a cyano group.

In some example embodiments, in Chemical Formula 1A, $Ar^{1a}$ and $Ar^{2a}$ may independently be one of a substituted or unsubstituted phenyl group, a substituted or unsubstituted naphthyl group, a substituted or unsubstituted anthracenyl group, a substituted or unsubstituted phenanthrenyl group, a substituted or unsubstituted pyridinyl group, a substituted or unsubstituted pyridazinyl group, a substituted or unsubstituted pyrimidinyl group, a substituted or unsubstituted pyrazinyl group, a substituted or unsubstituted quinolinyl group, a substituted or unsubstituted isoquinolinyl group, a substituted or unsubstituted naphthyridinyl group, a substituted or unsubstituted cinnolinyl group, a substituted or unsubstituted quinazolinyl group, a substituted or unsubstituted phthalazinyl group, a substituted or unsubstituted benzotriazinyl group, a substituted or unsubstituted pyridopyrazinyl group, a substituted or unsubstituted pyridopyrimidinyl group, or a substituted or unsubstituted pyridopyridazinyl group.

In some example embodiments, $Ar^{1a}$ and $Ar^{2a}$ of Chemical Formula 1A may be linked with each other to form a ring or in some example embodiments, $Ar^{1a}$ and $Ar^2a$ may be linked with each other by one of a single bond, —($CR^g R^h$)$_{n2}$— (n2 is 1 or 2), —O—, —S—, —Se—, —N=, —$NR^i$—, —$SiR^jR^k$—, or —$GeR^lR^m$—. Herein, $R^g$ to $R^m$ may independently be hydrogen, a substituted or unsubstituted C1 to C30 alkyl group, a substituted or unsubstituted C6 to C30 aryl group, a substituted or unsubstituted C3 to C30 heteroaryl group, a substituted or unsubstituted C1 to C6 alkoxy group, a halogen, or a cyano group.

In some example embodiments, the p-type semiconductor 32 represented by Chemical Formula 1 may be for example represented by Chemical Formula 1B or 1C.

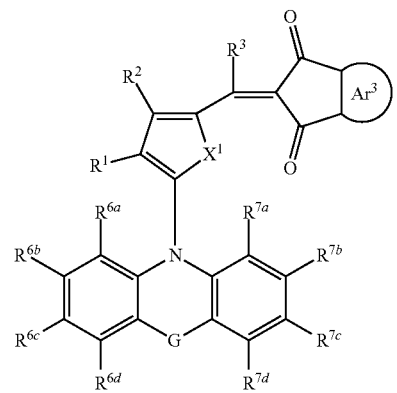

[Chemical Formula 1B]

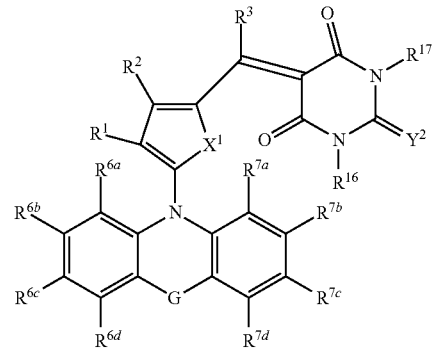

[Chemical Formula 1C]

In Chemical Formula 1B or 1C, $X^1$ is Se, Te, O, S, SO, or $SO_2$, $Ar^3$ may be a substituted or unsubstituted C6 to C30 arylene group, a substituted or unsubstituted C3 to C30 heterocyclic group, or a fused ring of the foregoing two or more, $R^1$ to $R^3$ may independently be one of hydrogen, deuterium, a substituted or unsubstituted C1 to C30 alkyl group, a substituted or unsubstituted C1 to C30 alkoxy group, a substituted or unsubstituted C6 to C30 aryl group, a substituted or unsubstituted C3 to C30 heteroaryl group, a halogen, a cyano group, a cyano-containing group, or a combination thereof, G may be one of a single bond, —O—, —S—, —Se—, —N=, —($CR^fR^g$)$_k$—, —$NR^h$—, —$SiR^iR^j$—, —$GeR^kR^l$—, —(C($R^m$)=C($R^n$))—, or Sn$R^o R^p$, wherein $R^f$, $R^g$, $R^h$, $R^i$, $R^j$, $R^k$, $R^l$, $R^m$, $R^n$, $R^o$, and $R^p$ may independently be one of hydrogen, a halogen, a substituted or unsubstituted C1 to C10 alkyl group, a substituted or unsubstituted C1 to C10 alkoxy group, or a substituted or unsubstituted C6 to C12 aryl group, $R^f$ and $R^g$, $R^i$ and $R^j$, $R^k$ and $R^l$, $R^m$ and $R^n$, and $R^o$ and $R^p$ may independently be present alone or may be linked with each other to provide a ring, and k may be 1 or 2, $Y^2$ may be one of O, S, Se, Te, or C($R^q$)(CN) (wherein $R^q$ is one of hydrogen, a cyano group (—CN), or a C1 to C10 alkyl group), $R^{6a}$ to $R^{6d}$, $R^{7a}$ to $R^{7d}$, $R^{16}$, and $R^{17}$ may independently be one of hydrogen, a substituted or unsubstituted C1 to C30 alkyl group, a substituted or unsubstituted C6 to C30 aryl group, a substituted or unsubstituted C3 to C30 heteroaryl group, a halogen, a cyano group, a cyano-containing group, or a combination thereof, $R^{6a}$ to $R^{6d}$ may independently be present or adjacent two thereof may be linked with each other to form a fused ring, and $R^{7a}$ to $R^{7d}$ may independently be present or adjacent two thereof may be linked with each other to form a fused ring.

In some example embodiments, $Ar^3$ of Chemical Formula 1B may be benzene, naphthylene, anthracene, thiophene, selenophene, tellurophene, pyridine, pyrimidine, or a fused ring of the foregoing two or more.

The n-type semiconductor 34 may be for example fullerene or a fullerene derivative, but is not limited thereto.

The active layer 30 may include an intrinsic layer (an I layer) wherein the p-type semiconductor 32 and the n-type semiconductor 34 are blended as a bulk heterojunction. Herein, the p-type semiconductor 32 and the n-type semiconductor 34 may be blended in a volume ratio of about 1:9 to about 9:1, for example about 2:8 to about 8:2, about 3:7 to about 7:3, about 4:6 to about 6:4, or about 5:5.

The active layer 30 may include a bi-layer including a p-type layer including the aforementioned p-type semiconductor 32 and an n-type layer including the aforementioned n-type semiconductor 34. Herein, a thickness ratio of the p-type layer and the n-type layer may be about 1:9 to about 9:1, for example about 2:8 to about 8:2, about 3:7 to about 7:3, about 4:6 to about 6:4, or about 5:5.

The active layer 30 may further include a p-type layer and/or an n-type layer in addition to the intrinsic layer. The p-type layer may include the aforementioned p-type semiconductor 32 and the n-type layer may include the aforementioned n-type semiconductor 34. In some example embodiments, they may be included in various combinations of p-type layer/I layer, I layer/n-type layer, p-type layer/I layer/n-type layer, and the like.

The auxiliary layer 40 may be a hole auxiliary layer between the anode 10 and the active layer 30, and the hole auxiliary layer may include for example a hole transport layer, a hole injection layer, and/or an electron blocking layer. The auxiliary layer 40 may serve as a path for transporting the charge carriers (e.g., holes) separated from the active layer 30 to the anode 10. Herein, the transporting direction of the charge carriers (e.g., holes) may be the active layer 30, the auxiliary layer 40, and the anode 10.

The auxiliary layer 40, in some example embodiments includes a plurality of layers, referred to herein as a plurality of auxiliary layers, where the plurality of auxiliary layers includes at least a first auxiliary layer 40a and a second auxiliary layer 40b. The first auxiliary layer 40a may be disposed to be the closest to the active layer 30, such that the first auxiliary layer 40a may be understood to be proximate to the active layer 30 in relation to the second auxiliary layer 40b and/or between the active layer 30 and the second auxiliary layer 40b, and may be, in some example embodiments, in contact with the active layer 30. The second auxiliary layer 40b may be disposed to be the closest to anode 10, such that the second auxiliary layer 40b may be understood to be proximate to the anode 10 in relation to the first auxiliary layer 40a and/or between the anode 10 and the first auxiliary layer 40a, and may be, in some example embodiments, in contact with the anode 10.

Figure 2:
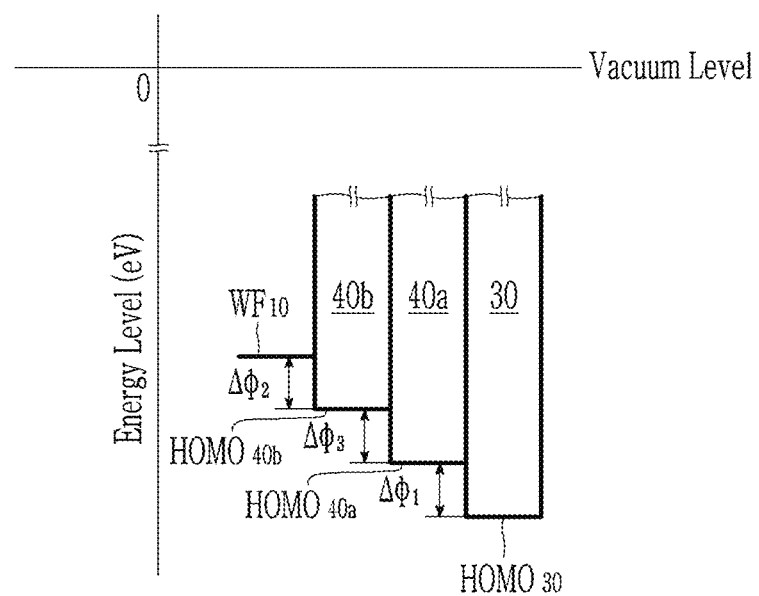
FIG. 2 is an energy diagram showing energy levels of the anode, auxiliary layer, and active layer in the device shown in FIG. 1.

FIG. 2 is an energy diagram showing energy levels of the anode 10, the auxiliary layer 40, and the active layer 30.

Referring to FIG. 2, separated holes in the active layer 30 may be transported to the anode 10 along the HOMO energy level. In some example embodiments, the holes may be transported along a HOMO energy level ($HOMO_{30}$) of the active layer 30, a HOMO energy level ($HOMO_{40a}$) of the first auxiliary layer 40a, a HOMO energy level of the second auxiliary layer 40b ($HOMO_{40b}$), and an work function ($WF_{10}$) of the anode 10.

Herein, the HOMO energy level ($HOMO_{30}$) of the active layer 30, the HOMO energy level ($HOMO_{40a}$) of the first auxiliary layer 40a, the HOMO energy level ($HOMO_{40b}$) of the second auxiliary layer 40b, and the work function ($WF_{10}$) of the anode 10 may become shallower sequentially from a vacuum level, in some example embodiments, the HOMO energy level ($HOMO_{30}$) of the active layer 30 may be the deepest, the work function ($WF_{10}$) of the anode 10 may be the shallowest, and the HOMO energy level ($HOMO_{40a}$) of the first auxiliary layer 40a and the HOMO energy level ($HOMO_{40b}$) of the second auxiliary layer 40b may be between the HOMO energy level ($HOMO_{30}$) of the active layer 30 and the work function ($WF_{10}$) of the anode 10. As a result, the magnitude of the HOMO energy level ($HOMO_{40a}$) of the first auxiliary layer 40a may be between the magnitude of the HOMO energy level ($HOMO_{30}$) of the active layer 30 and the magnitude of the HOMO energy level ($HOMO_{40b}$) of the second auxiliary layer 40b, and the magnitude of the HOMO energy level ($HOMO_{40b}$) of the second auxiliary layer 40b may be between the magnitude of the HOMO energy level ($HOMO_{40a}$) of the first auxiliary layer 40a and the magnitude of the work function ($WF_{10}$) of the anode 10. In other words, the HOMO energy level ($HOMO_{30}$) of the active layer 30, the HOMO energy level ($HOMO_{40a}$) of the first auxiliary layer 40a, the HOMO energy level ($HOMO_{40b}$) of the second auxiliary layer 40b, and the work function ($WF_{10}$) of the anode 10 may have a cascading energy level.

In some example embodiments, the HOMO energy level ($HOMO_{30}$) of the active layer 30, the HOMO energy level ($HOMO_{40a}$) of the first auxiliary layer 40a, the HOMO energy level ($HOMO_{40b}$) of the second auxiliary layer 40b, and the work function ($WF_{10}$) of the anode 10 may have a stepwise shape.

A particular (or, alternatively, predetermined) energy barrier may be present between adjacent layers, and herein, the energy barrier may include an energy barrier ($\Delta\phi_1$) between the active layer 30 and the first auxiliary layer 40a, an energy barrier ($\Delta\phi_2$) between the second auxiliary layer 40b and the anode 10, and an energy barrier ($\Delta\phi_3$) between the first auxiliary layer 40a and the second auxiliary layer 40b. The energy barrier ($\Delta\phi_1$) may be a difference between the HOMO energy level ($HOMO_{30}$) of the active layer 30 and the HOMO energy level ($HOMO_{40a}$) of the first auxiliary layer 40a, the energy barrier ($\Delta\phi_2$) may be a difference between the HOMO energy level ($HOMO_{40b}$) of the second auxiliary layer 40b and the work function ($WF_{10}$) of the anode 10, and the energy barrier ($\Delta\phi_3$) may be a difference between the HOMO energy level ($HOMO_{40a}$) of the first auxiliary layer 40a and the HOMO energy level ($HOMO_{40b}$) of the second auxiliary layer 40b.

A difference between the energy barriers ($\Delta\phi_1$, $\Delta\phi_2$, and $\Delta\phi_3$) between adjacent layers may be very small and may be substantially equal.

In some example embodiments, the energy barrier ($\Delta\phi_1$) between the active layer 30 and the first auxiliary layer 40a and the energy barrier ($\Delta\phi_2$) between the second auxiliary layer 40b and the anode 10 may have a small difference and/or be substantially equal. In some example embodiments, the energy diagrams of the active layer 30, the first auxiliary layer 40a, the second auxiliary layer 40b, and the anode 10 may satisfy Relationship Equation 1.

$|\Delta\phi_1 - \Delta\phi_2| \leq 0.1$ eV  [Relationship Equation 2]

In some example embodiments, the energy barrier ($\Delta\phi_1$) between the active layer 30 and the first auxiliary layer 40a and the energy barrier ($\Delta\phi_3$) between the first auxiliary layer 40a and the second auxiliary layer 40b may have a very small difference and/or be substantially equal. In some example embodiments, the energy diagrams of the active layer 30, the first auxiliary layer 40a, and the second auxiliary layer 40b may satisfy Relationship Equation 2.

$|\Delta\phi_1 - \Delta\phi_3| \leq 0.1$ eV  [Relationship Equation 2]

In some example embodiments, the energy barrier ($\Delta\phi_3$) between the first auxiliary layer 40a and the second auxiliary layer 40b and the energy barrier ($\Delta\phi_2$) between the second auxiliary layer 40b and the anode 10 may have a very small difference and/or be substantially equal. In some example embodiments, the energy diagrams of the first auxiliary layer 40a, the second auxiliary layer 40b, and the anode 10 may satisfy Relationship Equation 3.

$|\Delta\phi_3 - \Delta\phi_2| \leq 0.1$ eV  [Relationship Equation 3]

In some example embodiments, the energy barrier ($\Delta\phi_1$) between the active layer 30 and the first auxiliary layer 40a, the energy barrier ($\Delta\phi_2$) between the second auxiliary layer 40b and the anode 10, and the energy barrier ($\Delta\phi_3$) between the first auxiliary layer 40a and the second auxiliary layer 40b may have a small difference and/or be substantially equal. In some example embodiments, energy diagrams of the active layer 30, the first auxiliary layer 40a, the second auxiliary layer 40b, and the anode 10 may simultaneously satisfy Relationship Equations 1, 2, and 3.

Based on active layer 30, the first auxiliary layer 40a, the second auxiliary layer 40b, and the anode 10 satisfying one or more of Relationship Equations 1, 2, or 3, the energy barriers ($\Delta\phi_1$, $\Delta\phi_2$, and $\Delta\phi_3$) between the active layer 30, the first auxiliary layer 40a, the second auxiliary layer 40b, and the anode 10 satisfy one or more of Relationship Equations 1, 2, or 3 and thus may prevent a hole transport delay at the interface of the layers present in a path through which holes transport and thereby, exhibit high charge extraction efficiency. In addition, charge carriers undesirably remaining at the interface between adjacent layers may be reduced or prevented to reduce or prevent an after-image due to the accumulated remaining charge carriers. Therefore, electrical performance of the device 100, and/or a sensor, electronic device, or the like that includes the device 100, may be improved.

Within the range, the energy diagrams of the active layer 30, the first auxiliary layer 40a, the second auxiliary layer 40b, and the anode 10 may satisfy Relationship Equations 1A, 2A, and/or 3A.

$0 < |\Delta\phi_1 - \Delta\phi_2| \leq 0.1$ eV  [Relationship Equation 1A]

$0 < |\Delta\phi_1 - \Delta\phi_3| \leq 0.1$ eV  [Relationship Equation 2A]

$0 < |\Delta\phi_3 - \Delta\phi_2| \leq 0.1$ eV  [Relationship Equation 3A]

Within the range, the energy diagrams of the active layer 30, the first auxiliary layer 40a, the second auxiliary layer 40b, and the anode 10 may satisfy Relationship Equations 1B, 2B, and/or 3B.

$|\Delta\phi_1 - \Delta\phi_2| \leq 0.07$ eV  [Relationship Equation 1B]

$|\Delta\phi_1 - \Delta\phi_3| \leq 0.07$ eV  [Relationship Equation 2B]

$|\Delta\phi_3 - \Delta\phi_2| \leq 0.07$ eV  [Relationship Equation 3B]

Within the range, the energy diagrams of the active layer 30, the first auxiliary layer 40a, the second auxiliary layer 40b, and the anode 10 may satisfy Relationship Equations 1C, 2C, and/or 3C.

$0 < |\Delta\phi_1 - \Delta\phi_2| \leq 0.07$ eV  [Relationship Equation 1C]

$0 < |\Delta\phi_1 - \Delta\phi_3| \leq 0.07$ eV  [Relationship Equation 2C]

$0 < |\Delta\phi_3 - \Delta\phi_2| \leq 0.07$ eV  [Relationship Equation 3C]

Within the range, the energy diagrams of the active layer 30, the first auxiliary layer 40a, the second auxiliary layer 40b, and the anode 10 may satisfy Relationship Equations 1D, 2D, and/or 3D.

$|\Delta\phi_1 - \Delta\phi_2| \leq 0.05$ eV  [Relationship Equation 1D]

$|\Delta\phi_1 - \Delta\phi_3| \leq 0.05$ eV  [Relationship Equation 2D]

$|\Delta\phi_3 - \Delta\phi_2| \leq 0.05$ eV  [Relationship Equation 3D]

Within the range, the energy diagrams of the active layer 30, the first auxiliary layer 40a, the second auxiliary layer 40b, and the anode 10 may satisfy Relationship Equations 1E, 2E, and/or 3E.

$0 < |\Delta\phi_1 - \Delta\phi_2| \leq 0.05$ eV  [Relationship Equation 1E]

$0 < |\Delta\phi_1 - \Delta\phi_3| \leq 0.05$ eV  [Relationship Equation 2E]

$0 < |\Delta\phi_3 - \Delta\phi_2| \leq 0.05$ eV  [Relationship Equation 3E]

Within the range, the energy diagrams of the active layer 30, the first auxiliary layer 40a, the second auxiliary layer 40b, and the anode 10 may satisfy Relationship Equations 1F, 2F, and/or 3F.

$|\Delta\phi_1 - \Delta\phi_2| \leq 0.03$ eV  [Relationship Equation 1F]

$|\Delta\phi_1 - \Delta\phi_3| \leq 0.03$ eV  [Relationship Equation 2F]

$|\Delta\phi_3 - \Delta\phi_2| \leq 0.03$ eV  [Relationship Equation 3F]

Within the range, the energy diagrams of the active layer 30, the first auxiliary layer 40a, the second auxiliary layer 40b, and the anode 10 may satisfy Relationship Equations 1G, 2G, and/or 3G.

$0 < |\Delta\phi_1 - \Delta\phi_2| \leq 0.03$ eV  [Relationship Equation 1G]

$0 < |\Delta\phi_1 - \Delta\phi_3| \leq 0.03$ eV  [Relationship Equation 2G]

$0 < |\Delta\phi_3 - \Delta\phi_2| \leq 0.03$ eV  [Relationship Equation 3G]

Within the range, the energy diagrams of the active layer 30, the first auxiliary layer 40a, the second auxiliary layer 40b, and the anode 10 may satisfy Relationship Equations 1H, 2H, and/or 3H.

$|\Delta\phi_1-\Delta\phi_2|\leq 0.01$ eV  [Relationship Equation 1H]

$|\Delta\phi_1-\Delta\phi_3|\leq 0.01$ eV  [Relationship Equation 2H]

$|\Delta\phi_3-\Delta\phi_2|\leq 0.01$ eV  [Relationship Equation 3H]

Within the range, the energy diagrams of the active layer 30, the first auxiliary layer 40a, the second auxiliary layer 40b, and the anode 10 may satisfy Relationship Equations 1I, 2I and/or 3I.

$0<|\Delta\phi_1-\Delta\phi_2|\leq 0.01$ eV  [Relationship Equation 1I]

$0<|\Delta\phi_1-\Delta\phi_3|\leq 0.01$ eV  [Relationship Equation 2I]

$0<|\Delta\phi_3-\Delta\phi_2|\leq 0.01$ eV  [Relationship Equation 3I]

In some example embodiments, the energy barriers ($\Delta\phi_1$, $\Delta\phi_2$, and $\Delta\phi_3$) may be respectively (e.g., each of the energy barriers ($\Delta\phi_1$, $\Delta\phi_2$, and $\Delta\phi_3$) may be) less than or equal to about 0.5 eV and within the range, less than or equal to about 0.4 eV, less than or equal to about 0.3 eV, or less than or equal to about 0.25 eV. In some example embodiments, the energy barriers ($\Delta\phi_1$, $\Delta\phi_2$, and $\Delta\phi_3$) may be independently about 0.10 eV to about 0.25 eV and within the range, about 0.15 eV to about 0.25 eV, about 0.18 eV to about 0.25 eV, or about 0.20 eV to about 0.25 eV.

The first auxiliary layer 40a and the second auxiliary layer 40b may independently each have a thickness of less than or equal to about 10 nm, for example less than or equal to about 8 nm, less than or equal to about 7 nm, less than or equal to about 5 nm, or less than or equal to about 3 nm.

The first auxiliary layer 40a and the second auxiliary layer 40b may each include an organic material, an inorganic material, and/or an organic/inorganic material, respectively. In some example embodiments, at least one of the first auxiliary layer 40a or the second auxiliary layer 40b may include an organic material. In some example embodiments, the first auxiliary layer 40a and the second auxiliary layer 40b may each include an organic material.

In some example embodiments, the first auxiliary layer 40a and the second auxiliary layer 40b may each include a substituted or unsubstituted arylamine; a substituted or unsubstituted thiophene such as a substituted or unsubstituted oligothiophene and a substituted or unsubstituted polythiophene; a substituted or unsubstituted phenylene vinylene such as a substituted or unsubstituted oligophenylene vinylene and a substituted or unsubstituted polyphenylene vinylene; a substituted or unsubstituted quinacridone; a substituted or unsubstituted acene; a substituted or unsubstituted calcogene-containing fused compound; a substituted or unsubstituted squaraine; an oxide such as metal oxide and semi-metal oxide; or a combination thereof, within the range that satisfies the energy diagram described above.

In some example embodiments, the first auxiliary layer 40a and the second auxiliary layer 40b may each include 3,3'-bi[1,4]benzoxazino[2,3,4-kl]phenoxazine, Mes2B(p-4,4'-biphenyl-NPh(1-naphthyl), poly[bis(4-phenyl)(2,4,6-trimethylphenyl)amine], 4,4',4"-tris[phenyl(m-tolyl)amino] triphenylamine, N1,N1'-(biphenyl-4,4'-diyl)bis(N1-phenyl-N4,N4-di-m-tolylbenzene-1,4-diamine, 4,4',4"-tris[2-naphthyl(phenyl)amino] triphenylamine, N,N'-diphenyl-N,N'-di-[4-(N,N-diphenyl-amino)phenyl]benzidine, 2,2',7,7'-tetrakis[N,N-di(4-methoxyphenyl)amino]-9,9'-spirobifluorene, 2,5-bis(4-biphenylyl)thiophene, 2,5-bis(4-biphenylyl) terthiophene, α-Sexithiophene, ω,ω'-dihexylterthiophene, ω,ω'-diocthylterthiophene, poly[[4,8-bis[5-(2-ethylhexyl)-2-thienyl]benzo[1,2-b:4,5]dithiophene-2,6-diyl]-2,5-thiophenediyl[5,7-bis(2-ethylhexyl)-4,8-dioxo-4H,8H-benzo[1,2-c:4,5-c']dithiophene-1,3-diyl]], poly[(5,6-difluoro-2,1,3-benzothiadiazol-4,7-diyl)-alt-(3,3'"-di(2-octyldodecyl)-2,2',5',2",5",2'"-quaterthiophen-5,5'"-diyl)], poly(3-hexylthiophene-2,5-diyl), poly[2-methoxy-5-(2-ethylhexyloxy)-1,4-phenylenevinylene], 4,4'-bis[4-(di-p-tolylamino)styryl]biphenyl, N,N'-dimethylquinacridone, 2,8-dimethylanthra[2,3-b:6,7-b']dithiophene, benz[b]anthracene, tetracene, pentacene, poly[[4,8-bis[5-(2-ethylhexyl)-2-thienyl]benzo[1,2-b:4,5b']dithiophene-2,6-diyl][2-(2-ethyl-1-oxohexyl) thieno[3,4-b]thiophenediyl]], poly({4,8-bis[(2-ethylhexyl)oxy]benzo[1,2-b:4,5-b']dithiophene-2,6-diyl}{3-fluoro-2-[(2-ethylhexyl)carbonyl]thieno[3,4-b]thiophenediyl}), 2,4-bis[4-(N,N-diisobutylamino)-2,6-dihydroxyphenyl] squaraine, 2,4-bis[4-(N,N-diphenylamino)-2,6-dihydroxyphenyl] squaraine, molybdenum trioxide, copper(I) oxide, within the range that satisfies the energy diagram described above.

The electron buffer layer 50 may be disposed between the cathode 20 and the active layer 30 (e.g., between a second electrode and the active layer 30) and may transfer separated charge carriers (e.g., electrons) in the active layer 30 to the cathode 20. Herein, a transporting direction of the charge carriers (e.g., electrons) may be the active layer 30, the electron buffer layer 50, and the cathode 20. In some example embodiments, the electron buffer layer 50 may be in contact with the active layer 30. In some example embodiments, one surface of the electron buffer layer 50 may be in contact with the active layer 30 and the other surface of the electron buffer layer 50 may be in contact with the cathode 20.

The electron buffer layer 50 may include, in some example embodiments, an organic material, an inorganic material, and/or an organic/inorganic material. In some example embodiments, the electron buffer layer 50 may be a very thin film of several nanometers thickness, and may have, in some example embodiments, a thickness of less than or equal to about 8 nm, less than or equal to about 7 nm, less than or equal to about 5 nm, less than or equal to about 3 nm, or less than or equal to about 2 nm. The thickness of the electron buffer layer 50 may be, in some example embodiments, about 1 nm to about 8 nm, about 1 nm to about 7 nm, about 1 nm to about 5 nm, about 1 nm to about 3 nm, or about 1 nm to about 2 nm.

In some example embodiments, the electron buffer layer 50 may include an inorganic material, and may include an inorganic material having a lower work function than that of the cathode 20. In some example embodiments, the work function of electron buffer layer 50 may be about 0.5 eV or more smaller than the work function of the cathode 20. In some example embodiments, the work function of the cathode 20 may be greater than or equal to about 4.5 eV and the work function of the electron buffer layer 50 may be less than or equal to about 4.0 eV. In some example embodiments, the work function of the cathode 20 may be greater than or equal to about 4.5 eV and the work function of the electron buffer layer 50 may be less than or equal to about 3.5 eV. In some example embodiments, the work function of the cathode 20 may be greater than or equal to about 4.5 eV and the work function of the electron buffer layer 50 may be less than or equal to about 3.0 eV. In some example embodiments, the work function of the cathode 20 may be greater than or equal to about 4.5 eV and the work function of the electron buffer layer 50 may be less than or equal to about 2.8 eV. In some example embodiments, the work function of the cathode 20 may be about 4.5 eV to about 5.0 eV and the work function of the electron buffer layer 50 may be, about 1.5 eV to about 4.0 eV, about 1.5 eV to about 3.5 eV, about 1.5 eV to about 3.0 eV, or about 1.5 eV to about 2.8 eV.

The electron buffer layer 50 may be made of (e.g., may at least partially comprise) a material that may be formed by thermal evaporation and simultaneously may satisfy the work function described above. In this way, the electron buffer layer 50 formed through the thermal evaporation may prevent thermal physical damage on the active layer 30 during formation of the electron buffer layer 50 and/or a subsequent process thereof and thus effectively prevent performance degradation of a device 100, and/or a sensor, electronic device, or the like that includes the device 100, due to the degradation of the active layer 30.

Inorganic materials capable of satisfying these characteristics, and thus which the electron buffer layer 50 (including any layers included therein) may at least partially comprise, may include for example a lanthanide element, calcium (Ca), potassium (K), aluminum (Al), or an alloy thereof. The lanthanide element may include for example ytterbium (Yb).

The electron buffer layer 50 may be omitted.

The device 100 may further include an anti-reflective layer 90 on the anode 10 or the cathode 20. The anti-reflective layer 90 is disposed at a light-incidence side to further improve light absorbance by lowering reflectance of incident light. In some example embodiments, when light is incident on the anode 10, the anti-reflective layer 90 may be disposed at (e.g., in contact with) one surface of the anode 10 while when light is incident on the cathode 20, the anti-reflective layer 90 may be disposed at (e.g., in contact with) one surface of the cathode 20.

The anti-reflective layer 90 may include, for example a material having a refractive index of about 1.6 to about 2.5, and may include for example at least one of metal oxide, metal sulfide, or an organic material having a refractive index within the ranges. The anti-reflective layer 90 may include, for example a metal oxide such as aluminum-containing oxide, molybdenum-containing oxide, tungsten-containing oxide, vanadium-containing oxide, rhenium-containing oxide, niobium-containing oxide, tantalum-containing oxide, titanium-containing oxide, nickel-containing oxide, copper-containing oxide, cobalt-containing oxide, manganese-containing oxide, chromium-containing oxide, tellurium-containing oxide, or a combination thereof; metal sulfide such as zinc sulfide; or an organic material such as an amine derivative, but is not limited thereto.

The device 100 may be configured to generate an exciton internally when light is incident from the anode 10 or the cathode 20 and the active layer 30 is configured to absorb light of a particular (or, alternatively, predetermined) wavelength spectrum. The excitons may be separated into holes and electrons in the active layer 30, and the separated holes may be transported to the anode 10 through the first auxiliary layer 40a and the second auxiliary layer 40b, while the separated electrons may be transported to the cathode 20 through the electron buffer layer 50 so as to flow a current.

Figure 3:
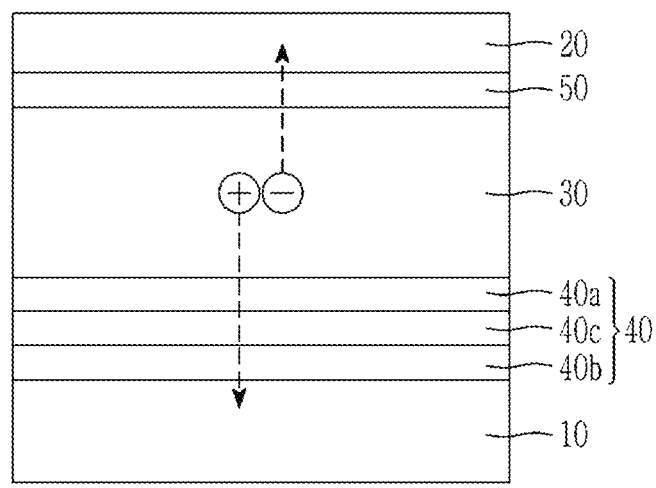
FIG. 3 is a cross-sectional view showing a device according to some example embodiments.

FIG. 3 is a cross-sectional view showing a device according to some example embodiments.

Referring to FIG. 3, like some example embodiments, including the example embodiments shown in FIGS. 1-2, a device 100 according to some example embodiments includes an anode 10 and a cathode 20 facing each other; an active layer 30 between the anode 10 and the cathode 20; an auxiliary layer 40 between the anode 10 and the active layer 30; and an electron buffer layer 50 between the cathode 20 and the active layer 30. Each constituent element is the same as described above.

Figure 4:
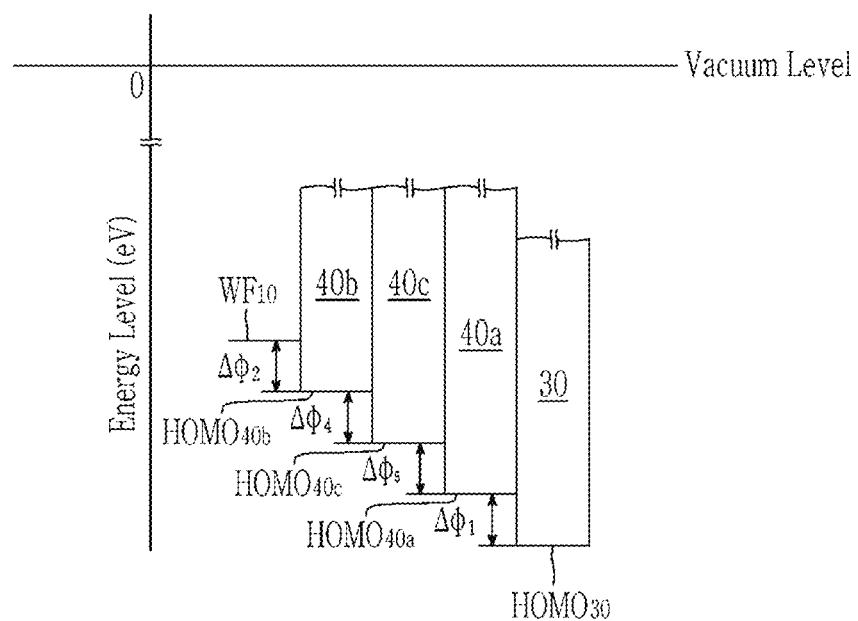
FIG. 4 is an energy diagram showing energy levels of the anode, auxiliary layer, and active layer in the device shown in FIG. 3.

However in some example embodiments including the example embodiments shown in FIGS. 3-4, unlike some example embodiments, including the example embodiments shown in FIGS. 1-2, the auxiliary layer 40 (e.g., the plurality of auxiliary layers that at least partially comprises the auxiliary layer 40) further includes a third auxiliary layer 40c in addition to the first auxiliary layer 40a and the second auxiliary layer 40b. The third auxiliary layer 40c may be between the first auxiliary layer 40a and the second auxiliary layer 40b, for example one surface of the third auxiliary layer 40c may be in contact with the first auxiliary layer 40a and the other surface of the third auxiliary layer 40c may be in contact with the second auxiliary layer 40b.

The first auxiliary layer 40a, the third auxiliary layer 40c, and the second auxiliary layer 40b may have a sequentially stacked structure, so that a transporting direction of the separated charge carriers (e.g., holes) in the active layer 30 may be the active layer 30, the first auxiliary layer 40a, the third auxiliary layer 40c, the second auxiliary layer 40b, and the anode 10.

FIG. 4 is an energy diagram showing energy levels of the anode 10, the auxiliary layer 40, and the active layer 30 in the device shown in FIG. 3.

Referring to FIG. 4, separated holes in the active layer 30 may be transported to the anode 10 along the HOMO energy level, in some example embodiments, along the HOMO energy level ($HOMO_{30}$) of the active layer 30, the HOMO energy level ($HOMO_{40a}$) of a first auxiliary layer 40a, the HOMO energy level ($HOMO_{40c}$) of a third auxiliary layer 40c, the HOMO energy level ($HOMO_{40b}$) of a second auxiliary layer 40b, and the work function ($WF_{10}$) of the anode 10.

Herein, the HOMO energy level ($HOMO_{30}$) of the active layer 30, the HOMO energy level ($HOMO_{40a}$) of the first auxiliary layer 40a, the HOMO energy level ($HOMO_{40c}$) of the third auxiliary layer 40c, the HOMO energy level ($HOMO_{40b}$) of the second auxiliary layer 40b, and the work function ($WF_{10}$) of the anode 10 may become shallower sequentially, in some example embodiments, the HOMO energy level ($HOMO_{30}$) of the active layer 30 may be the deepest, the work function ($WF_{10}$) of the anode 10 may be the shallowest, and the HOMO energy level ($HOMO_{40a}$) of the first auxiliary layer 40a, the HOMO energy level ($HOMO_{40c}$) of the third auxiliary layer 40c, and the HOMO energy level ($HOMO_{40b}$) of the second auxiliary layer 40b may be between the HOMO energy level ($HOMO_{30}$) of the active layer 30 and the work function ($WF_{10}$) of the anode 10. As a result, the magnitude of the HOMO energy level ($HOMO_{40a}$) of the first auxiliary layer 40a may be between the magnitude of the HOMO energy level ($HOMO_{30}$) of the active layer 30 and the magnitude of the HOMO energy level ($HOMO_{40c}$) of the third auxiliary layer 40c, the magnitude of the HOMO energy level ($HOMO_{40c}$) of the third auxiliary layer 40c may be between the magnitude of the HOMO energy level ($HOMO_{40a}$) of the first auxiliary layer 40a and the magnitude of the HOMO energy level ($HOMO_{40b}$) of the second auxiliary layer 40b, and the magnitude of the HOMO energy level ($HOMO_{40b}$) of the second auxiliary layer 40b may be between the magnitude of the HOMO energy level ($HOMO_{40c}$) of the third auxiliary layer 40c and the magnitude of the work function ($WF_{10}$) of the anode 10. In other words, the HOMO energy level ($HOMO_{30}$) of the active layer 30, the HOMO energy level ($HOMO_{40a}$) of the first auxiliary layer 40a, the HOMO energy level (HOMO$_{40c}$) of the third auxiliary layer 40c, the HOMO energy level (HOMO$_{40b}$) of the second auxiliary layer 40b, and the work function (WF$_{10}$) of the anode 10 may have a cascading energy level.

In some example embodiments, the HOMO energy level (HOMO$_{30}$) of the active layer 30, the HOMO energy level (HOMO$_{40a}$) of the first auxiliary layer 40a, the HOMO energy level (HOMO$_{40c}$) of the third auxiliary layer 40c, the HOMO energy level (HOMO$_{40b}$) of the second auxiliary layer 40b, and the work function (WF$_{10}$) of the anode 10 may have a stepwise shape.

In some example embodiments, a particular (or, alternatively, predetermined) energy barrier between the adjacent layers may be present, and herein, the energy barrier may include an energy barrier ($\Delta\phi_1$) between the active layer 30 and the first auxiliary layer 40a, an energy barrier ($\Delta\phi_2$) between the second auxiliary layer 40b and the anode 10, an energy barrier ($\Delta\phi_4$) between the third auxiliary layer 40c and the second auxiliary layer 40b, and an energy barrier ($\Delta\phi_5$) between the first auxiliary layer 40a and the third auxiliary layer 40c. The energy barrier ($\Delta\phi_1$) may be a difference between the HOMO energy level (HOMO$_{30}$) of the active layer 30 and the HOMO energy level (HOMO$_{40a}$) of the first auxiliary layer 40a, the energy barrier ($\Delta\phi_2$) may be a difference between the HOMO energy level (HOMO$_{40b}$) of the second auxiliary layer 40b and the work function (WF$_{10}$) of the anode 10, the energy barrier ($\Delta\phi_4$) may be a difference between the HOMO energy level (HOMO$_{40c}$) of the third auxiliary layer 40c and the HOMO energy level (HOMO$_{40b}$) of the second auxiliary layer 40b, and the energy barrier ($\Delta\phi_5$) may be a difference between the HOMO energy level (HOMO$_{40a}$) of the first auxiliary layer 40a and the HOMO energy level (HOMO$_{40c}$) of the third auxiliary layer 40c.

Each energy barrier ($\Delta\phi_1$, $\Delta\phi_2$, $\Delta\phi_4$, $\Delta\phi_5$) difference between adjacent layers may be very small and/or be substantially equal.

In some example embodiments, the energy barrier ($\Delta\phi_1$) between the active layer 30 and the first auxiliary layer 40a and the energy barrier ($\Delta\phi_2$) between the second auxiliary layer 40b and the anode 10 may have a very small difference and/or be substantially equal. In some example embodiments, the energy diagrams of the active layer 30, the first auxiliary layer 40a, the second auxiliary layer 40b, and the anode 10 may satisfy Relationship Equation 1.

In some example embodiments, the energy barrier ($\Delta\phi_2$) between the second auxiliary layer 40b and the anode 10 and the energy barrier ($\Delta\phi_4$) between the third auxiliary layer 40c and the second auxiliary layer 40b may have a very small difference and/or be substantially equal. In some example embodiments, the energy diagrams of the third auxiliary layer 40c, the second auxiliary layer 40b, and the anode 10 may satisfy Relationship Equation 4.

$$|\Delta\phi_2-\Delta\phi_4|\leq 0.1 \text{ eV} \qquad \text{[Relationship Equation 4]}$$

In some example embodiments, the energy barrier ($\Delta\phi_1$) between the active layer 30 and the first auxiliary layer 40a and the energy barrier ($\Delta\phi_5$) between the first auxiliary layer 40a and the third auxiliary layer 40c may have a small difference and/or be substantially equal. In some example embodiments, the energy diagrams of the active layer 30, the first auxiliary layer 40a, and the third auxiliary layer 40c may satisfy Relationship Equation 5.

$$|\Delta\phi_1-\Delta\phi_5|\leq 0.1 \text{ eV} \qquad \text{[Relationship Equation 5]}$$

In some example embodiments, the energy barrier ($\Delta\phi_4$) between the second auxiliary layer 40b and the third auxiliary layer 40c and the energy barrier ($\Delta\phi_5$) between the first auxiliary layer 40a and the third auxiliary layer 40c may have a very small difference and/or be substantially equal. In some example embodiments, the energy diagrams of the first auxiliary layer 40a, third auxiliary layer 40c and second auxiliary layer 40b may satisfy Relationship Equation 6.

$$|\Delta\phi_4-\Delta\phi_5|\leq 0.1 \text{ eV} \qquad \text{[Relationship Equation 6]}$$

In some example embodiments, the energy barrier ($\Delta\phi_1$) between the active layer 30 and the first auxiliary layer 40a, the energy barrier ($\Delta\phi_2$) between the second auxiliary layer 40b and the anode 10, the energy barrier ($\Delta\phi_4$) between the third auxiliary layer 40c and the second auxiliary layer 40b, and the energy barrier ($\Delta\phi_5$) between the first auxiliary layer 40a and the third auxiliary layer 40c may have a very small difference and/or be substantially equal. In some example embodiments, the energy diagrams of the active layer 30, the first auxiliary layer 40a, the third auxiliary layer 40c, the second auxiliary layer 40b, and the anode 10 may satisfy Relationship Equations 4, 5, and 6 simultaneously.

Based on the active layer 30, the first auxiliary layer 40a, the third auxiliary layer 40c, the second auxiliary layer 40b, and the anode 10 satisfying one or more of Relationship Equations 4, 5, or 6, the energy barriers ($\Delta\phi_1$, $\Delta\phi_2$, $\Delta\phi_4$, $\Delta\phi_5$) between the active layer 30, the first auxiliary layer 40a, the third auxiliary layer 40c, the second auxiliary layer 40b, and the anode 10 satisfy one or more of Relationship Equations 4, 5, or 6 and thus may prevent a hole transport delay at the interface of the layers in a path through which holes transport and thereby exhibit high charge extraction efficiency. In addition, charge carriers undesirably remaining at the interface between adjacent layers may be reduced or prevented to reduce or prevent an after-image due to the accumulated remaining charge carriers. Therefore, electrical performance of the device 100, and/or a sensor, electronic device, or the like that includes the device 100, may be improved.

Within the range, the energy diagrams of the active layer 30, the first auxiliary layer 40a, the third auxiliary layer 40c, the second auxiliary layer 40b, and the anode 10 may satisfy Relationship Equations 4A, 5A, and/or 6A.

$$0<|\Delta\phi_2-\Delta\phi_4|\leq 0.1 \text{ eV} \qquad \text{[Relationship Equation 4A]}$$

$$0<|\Delta\phi_1-\Delta\phi_5|\leq 0.1 \text{ eV} \qquad \text{[Relationship Equation 5A]}$$

$$0<|\Delta\phi_4-\Delta\phi_5|\leq 0.1 \text{ eV} \qquad \text{[Relationship Equation 6A]}$$

Within the range, the energy diagrams of the active layer 30, the first auxiliary layer 40a, the third auxiliary layer 40c, the second auxiliary layer 40b, and the anode 10 may satisfy Relationship Equations 4B, 5B, and/or 6B.

$$|\Delta\phi_2-\Delta\phi_4|\leq 0.7 \text{ eV} \qquad \text{[Relationship Equation 4B]}$$

$$|\Delta\phi_1-\Delta\phi_5|\leq 0.7 \text{ eV} \qquad \text{[Relationship Equation 5B]}$$

$$|\Delta\phi_4-\Delta\phi_5|\leq 0.7 \text{ eV} \qquad \text{[Relationship Equation 6B]}$$

Within the range, the energy diagrams of the active layer 30, the first auxiliary layer 40a, the third auxiliary layer 40c, the second auxiliary layer 40b, and the anode 10 may satisfy Relationship Equations 4C, 5C, and/or 6C.

$$0<|\Delta\phi_2-\Delta\phi_4|\leq 0.7 \text{ eV} \qquad \text{[Relationship Equation 4C]}$$

$$0<|\Delta\phi_1-\Delta\phi_5|\leq 0.7 \text{ eV} \qquad \text{[Relationship Equation 5C]}$$

$$0<|\Delta\phi_4-\Delta\phi_5|\leq 0.7 \text{ eV} \qquad \text{[Relationship Equation 6C]}$$

Within the range, the energy diagrams of the active layer 30, the first auxiliary layer 40a, the third auxiliary layer 40c, the second auxiliary layer 40b, and the anode 10 may satisfy Relationship Equations 4D, 5D, and/or 6D.

$|\Delta\phi_2-\Delta\phi_4|\leq 0.05$ eV   [Relationship Equation 4D]

$|\Delta\phi_1-\Delta\phi_5|\leq 0.05$ eV   [Relationship Equation 5D]

$|\Delta\phi_4-\Delta\phi_5|\leq 0.05$ eV   [Relationship Equation 6D]

Within the range, the energy diagrams of the active layer 30, the first auxiliary layer 40a, the third auxiliary layer 40c, the second auxiliary layer 40b, and the anode 10 may satisfy Relationship Equations 4E, 5E, and/or 6E.

$0<|\Delta\phi_2-\Delta\phi_4|\leq 0.05$ eV   [Relationship Equation 4E]

$0<|\Delta\phi_1-\Delta\phi_5|\leq 0.05$ eV   [Relationship Equation 5E]

$0<|\Delta\phi_4-\Delta\phi_5|\leq 0.05$ eV   [Relationship Equation 6E]

Within the range, the energy diagrams of the active layer 30, the first auxiliary layer 40a, the third auxiliary layer 40c, the second auxiliary layer 40b, and the anode 10 may satisfy Relationship Equations 4F, 5F, and/or 6F.

$|\Delta\phi_2-\Delta\phi_4|\leq 0.03$ eV   [Relationship Equation 4F]

$|\Delta\phi_1-\Delta\phi_5|\leq 0.03$ eV   [Relationship Equation 5F]

$|\Delta\phi_4-\Delta\phi_5|\leq 0.03$ eV   [Relationship Equation 6F]

Within the range, the energy diagrams of the active layer 30, the first auxiliary layer 40a, the third auxiliary layer 40c, the second auxiliary layer 40b, and the anode 10 may satisfy Relationship Equations 4G, 5G, and/or 6G.

$0<|\Delta\phi_2-\Delta\phi_4|\leq 0.03$ eV   [Relationship Equation 4G]

$0<|\Delta\phi_1-\Delta\phi_5|\leq 0.03$ eV   [Relationship Equation 5G]

$0<|\Delta\phi_4-\Delta\phi_5|\leq 0.03$ eV   [Relationship Equation 6G]

Within the range, the energy diagrams of the active layer 30, the first auxiliary layer 40a, the third auxiliary layer 40c, the second auxiliary layer 40b, and the anode 10 may satisfy Relationship Equations 4H, 5H, and/or 6H.

$|\Delta\phi_2-\Delta\phi_4|\leq 0.01$ eV   [Relationship Equation 4H]

$|\Delta\phi_1-\Delta\phi_5|\leq 0.01$ eV   [Relationship Equation 5H]

$|\Delta\phi_4-\Delta\phi_5|\leq 0.01$ eV   [Relationship Equation 6H]

Within the range, the energy diagrams of the active layer 30, the first auxiliary layer 40a, the third auxiliary layer 40c, the second auxiliary layer 40b, and the anode 10 may satisfy Relationship Equations 4I, 5I, and/or 6I.

$0<|\Delta\phi_2-\Delta\phi_4|\leq 0.01$ eV   [Relationship Equation 4I]

$0<|\Delta\phi_1-\Delta\phi_5|\leq 0.01$ eV   [Relationship Equation 5I]

$0<|\Delta\phi_4-\Delta\phi_5|\leq 0.01$ eV   [Relationship Equation 6I]

In some example embodiments, the energy barriers ($\Delta\phi_1\Delta\phi_2$, $\Delta\phi_4$, $\Delta\phi_4$) may be respectively (e.g., may each be) less than or equal to about 0.5 eV and within the range, less than or equal to about 0.4 eV, less than or equal to about 0.3 eV, or less than or equal to about 0.25 eV. In some example embodiments, the energy barriers ($\Delta\phi_1\Delta\phi_2$, $\Delta\phi_4$, $\Delta\phi_4$) may be independently about 0.10 eV to about 0.25 eV and within the range, about 0.15 eV to about 0.25 eV, about 0.18 eV to about 0.25 eV, or about 0.20 eV to about 0.25 eV.

The first auxiliary layer 40a, the second auxiliary layer 40b, and the third auxiliary layer 40c may independently have each thickness of less than or equal to about 10 nm, for example less than or equal to about 8 nm, less than or equal to about 7 nm, less than or equal to about 5 nm, or less than or equal to about 3 nm.

The first auxiliary layer 40a, the second auxiliary layer 40b, and the third auxiliary layer 40c may include an organic material, an inorganic material, and/or an organic/inorganic material, respectively. In some example embodiments, at least one of the first auxiliary layer 40a, the second auxiliary layer 40b, or the third auxiliary layer 40c may include an organic material. In some example embodiments, the first auxiliary layer 40a, the second auxiliary layer 40b, and the third auxiliary layer 40c may each include an organic material.

Figure 5:
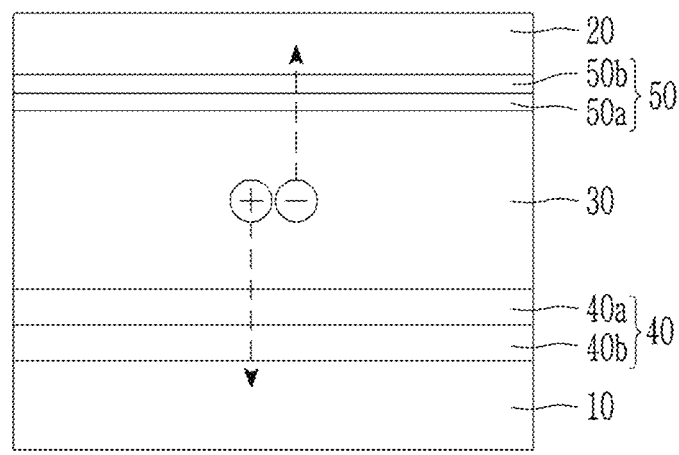
FIG. 5 is a cross-sectional view showing a device according to some example embodiments.

FIG. 5 is a cross-sectional view showing a device according to some example embodiments.

Referring to FIG. 5, like some example embodiments, including the example embodiments shown in FIGS. 1-2, a device 100 includes an anode 10 and a cathode 20 facing each other; an active layer 30 between the anode 10 and the cathode 20; an auxiliary layer 40 between the anode 10 and the active layer 30 and including a first auxiliary layer 40a and a second auxiliary layer 40b; and an electron buffer layer 50 between the cathode 20 and the active layer 30. Each constituent element is the same as described above.

Figure 6:
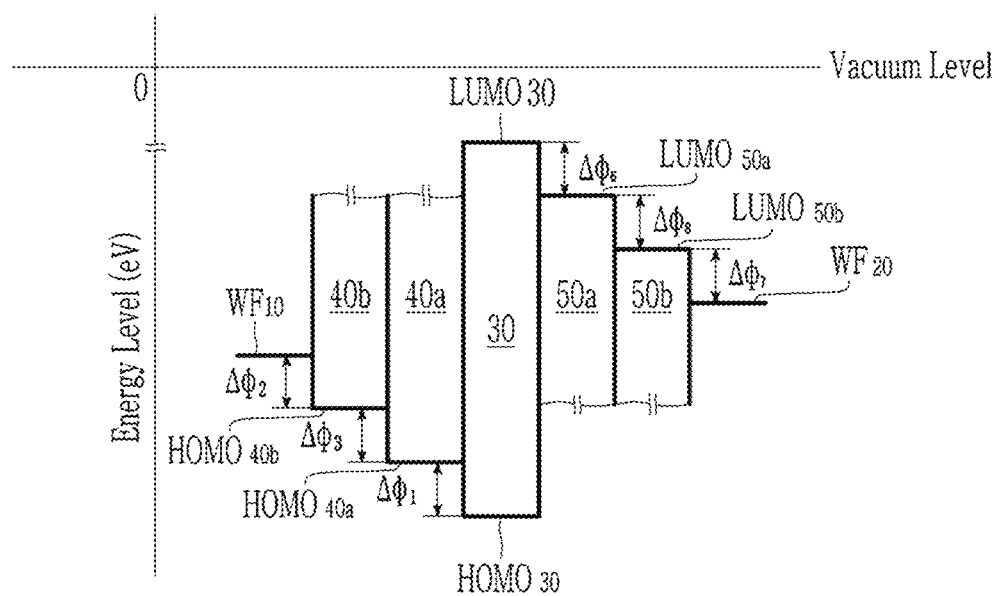
FIG. 6 is an energy diagram showing energy levels of the device shown in FIG. 5.

However in some example embodiments including the example embodiments shown in FIGS. 5-6, unlike some example embodiments, including the example embodiments shown in FIGS. 1-2, the electron buffer layer 50 includes a first electron buffer layer 50a and a second electron buffer layer 50b. The first electron buffer layer 50a may be disposed closest to the active layer 30, such that the first electron buffer layer 50a may be understood to be proximate to the active layer 30 in relation to the second electron buffer layer 50b and/or between the active layer 30 and the second electron buffer layer 50b and may be, in some example embodiments, in contact with the active layer 30. The second electron buffer layer 50b may be disposed closest to the cathode 20, such that the second electron buffer layer 50b may be understood to be proximate to the cathode 20 in relation to the first electron buffer layer 50a and/or between the cathode 20 and the first electron buffer layer 50a and may be, in some example embodiments, in contact with the cathode 20.

FIG. 6 is an energy diagram showing energy levels of elements of the device of FIG. 5.

Separated Holes in the active layer 30 may be transported to the anode 10 along the HOMO energy level. In some example embodiments, the holes may be transported along a HOMO energy level ($HOMO_{30}$) of the active layer 30, a HOMO energy level ($HOMO_{40a}$) of the first auxiliary layer 40a, a HOMO energy level of the second auxiliary layer 40b ($HOMO_{40b}$), and a work function ($WF_{10}$) of the anode 10. Specific description is the same as described above.

Separated electrons in the active layer 30 may be transported to the cathode 20 along a LUMO energy level. In some example embodiments, the electrons may be transported along a LUMO energy level ($LUMO_{30}$) of the active layer 30, a LUMO energy level ($LUMO_{50a}$) of the first electron buffer layer 50a, a LUMO energy level of ($LUMO_{50b}$) of the second electron buffer layer 50b, and a work function ($WF_{20}$) of the cathode 20. In some example embodiments, the LUMO energy level ($LUMO_{30}$) of the active layer 30, the LUMO energy level ($LUMO_{50a}$) of the first electron buffer layer 50a, the LUMO energy level ($LUMO_{50b}$) of the second electron buffer layer 50b, and the work function ($WF_{20}$) of the cathode 20 may have a stepwise shape, such that, in some example embodiments, the LUMO energy level (LUMO$_{30}$) of the active layer 30, the LUMO energy level (LUMO$_{50a}$) of the first electron buffer layer 50a, a LUMO energy level of (LUMO$_{50b}$) of the second electron buffer layer 50b, and the work function (WF$_{20}$) of the cathode 20 may become deeper sequentially, such that the magnitude of the LUMO energy level (LUMO$_{50a}$) of the first electron buffer layer 50a is between the magnitude of the LUMO energy level (LUMO$_{30}$) of the active layer 30 and the magnitude of the LUMO energy level of (LUMO$_{50b}$) of the second electron buffer layer 50b, and the magnitude of the LUMO energy level of (LUMO$_{50b}$) of the second electron buffer layer 50b is between the magnitude of the LUMO energy level (LUMO$_{50a}$) of the first electron buffer layer 50a and the magnitude of the work function (WF$_{20}$) of the cathode 20.

A particular (or, alternatively, predetermined) energy barrier may be present between the adjacent layers, and herein, the energy barrier may include an energy barrier ($\Delta\phi_6$) between the active layer 30 and the first electron buffer layer 50a, an energy barrier ($\Delta\phi_7$) between the second electron buffer layer 50b and the cathode 20 and an energy barrier ($\Delta\phi_8$) between the first electron buffer layer 50a and the second electron buffer layer 50b. The energy barrier ($\Delta\phi_6$) may be a difference between the LUMO energy level (LUMO$_{30}$) of the active layer 30 and the LUMO energy level (LUMO$_{50a}$) of the first electron buffer layer 50a, the energy barrier ($\Delta\phi_7$) may be a difference between the LUMO energy level (LUMO$_{50b}$) of the second electron buffer layer 50b and the work function (WF$_{20}$) of the cathode 20, and the energy barrier ($\Delta\phi_8$) may be a difference between the LUMO energy level (LUMO$_{50a}$) of the first electron buffer layer 50a and the LUMO energy level (LUMO$_{50b}$) of the second electron buffer layer 50b.

Each energy barrier ($\Delta\phi_6$, $\Delta\phi_7$, $\Delta\phi_8$) between the adjacent layers may have a small difference and/or be substantially equal.

In some example embodiments, the energy barrier ($\Delta\phi_6$) between the active layer 30 and the first electron buffer layer 50a and the energy barrier ($\Delta\phi_7$) between the second electron buffer layer 50b and the cathode 20 may have a very small difference and/or be substantially equal. In some example embodiments, the energy diagrams of the active layer 30, the first electron buffer layer 50a, the second electron buffer layer 50b, and the cathode 20 may satisfy Relationship Equation 7.

$|\Delta\phi_6 - \Delta\phi_7| \leq 0.1$ eV  [Relationship Equation 7]

In some example embodiments, the energy barrier ($\Delta\phi_6$) between the active layer 30 and the first electron buffer layer 50a and the energy barrier ($\Delta\phi_8$) between the first electron buffer layer 50a and the second electron buffer layer 50b may have a very small difference and/or be substantially equal. In some example embodiments, the energy diagrams of the active layer 30, the first electron buffer layer 50a, and the second electron buffer layer 50b may satisfy Relationship Equation 8.

$|\Delta\phi_6 - \Delta\phi_8| \leq 0.1$ eV  [Relationship Equation 8]

In some example embodiments, the energy barrier ($\Delta\phi_8$) between the first electron buffer layer 50a and the second electron buffer layer 50b and the energy barrier ($\Delta\phi_7$) between the second electron buffer layer 50b and the cathode 20 may have a small difference and/or be substantially equal. In some example embodiments, the energy diagrams of the first electron buffer layer 50a, the second electron buffer layer 50b, and the cathode 20 may satisfy Relationship Equation 9.

$|\Delta\phi_7 - \Delta\phi_8| \leq 0.1$ eV  [Relationship Equation 9]

In some example embodiments, the energy barrier ($\Delta\phi_6$) between the active layer 30 and the first electron buffer layer 50a, the energy barrier ($\Delta\phi_7$) between the second electron buffer layer 50b and the cathode 20, and the energy barrier ($\Delta\phi_8$) between the first electron buffer layer 50a and the second electron buffer layer 50b may have a small difference and/or be substantially equal. In some example embodiments, the energy diagrams of the active layer 30, the first electron buffer layer 50a, the second electron buffer layer 50b, and the cathode 20 may satisfy Relationship Equations 7, 8, and 9 simultaneously.

Based on the anode 10, the first and second auxiliary layers 40a and 40b, the active layer 30, the first and second electron buffer layers 50a and 50b, and the cathode 20 satisfying one or more of Relationship Equations 7, 8, or 9, the energy barriers ($\Delta\phi_1$, $\Delta\phi_2$, and $\Delta\phi_3$) between the anode 10, the first and second auxiliary layers 40a and 40b, and the active layer 30 and the energy barriers ($\Delta\phi_6$, $\Delta\phi_7$, and $\Delta\phi_8$) between the active layer 30, the first and second electron buffer layers 50a and 50b, and the cathode 20 may satisfy one or more of Relationship Equations 7, 8, or 9 and thus may prevent a hole transport delay at the interface of the layers in a path through which holes transport and simultaneously, an electron transport delay at the interface of the layers in a path through which electrons transport and accordingly, exhibit much higher charge extraction efficiency. In addition, undesirably remaining charge carriers at the interface between the adjacent layers may be reduced or prevented to further reduce or prevent an after-image due to the accumulated remaining charge carriers. Therefore, electrical performance of the device 100, and/or a sensor, electronic device, or the like that includes the device 100, may be further improved.

In some example embodiments, the energy barriers ($\Delta\phi_1$, $\Delta\phi_2$, $\Delta\phi_3$, $\Delta\phi_6$, $\Delta\phi_7$, $\Delta\phi_8$) may be respectively (e.g., may each be) less than or equal to about 0.5 eV and within the range, less than or equal to about 0.4 eV, less than or equal to about 0.3 eV, or less than or equal to about 0.25 eV. In some example embodiments, energy barriers ($\Delta\phi_1$, $\Delta\phi_2$, $\Delta\phi_3$, $\Delta\phi_6$, $\Delta\phi_7$, $\Delta\phi_8$) may be independently about 0.10 eV to about 0.25 eV and within the range, about 0.15 eV to about 0.25 eV, about 0.18 eV to about 0.25 eV, or about 0.20 eV to about 0.25 eV.

The first electron buffer layer 50a and the second electron buffer layer 50b may independently have each thickness of less than or equal to about 10 nm, for example less than or equal to about 8 nm, less than or equal to about 7 nm, less than or equal to about 5 nm, or less than or equal to about 3 nm.

The first electron buffer layer 50a and the second electron buffer layer 50b may include an organic material, an inorganic material, and/or an organic/inorganic material, respectively. In some example embodiments, at least one of the first electron buffer layer 50a or the second electron buffer layer 50b may include an organic material. In some example embodiments, the first electron buffer layer 50a and the second electron buffer layer 50b may each include an organic material.

Figure 7:
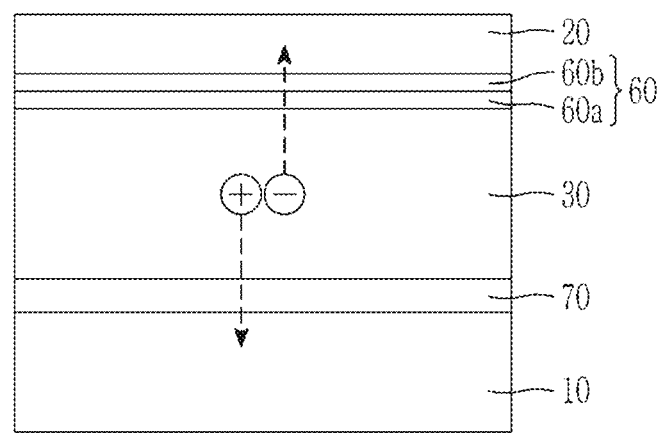
FIG. 7 is a cross-sectional view showing a device according to some example embodiments.

FIG. 7 is a cross-sectional view showing a device according to some example embodiments.

Referring to FIG. 7, a device 100 includes an anode 10, a cathode 20, an active layer 30, an auxiliary layer 60, and a hole buffer layer 70.

The anode 10, the cathode 20, and the active layer 30 are the same as described above.

The auxiliary layer 60 may be an electron auxiliary layer between the cathode 20 and the active layer 30, and the electron auxiliary layer may include, in some example embodiments, an electron transport layer, an electron injection layer, and/or a hole blocking layer. The auxiliary layer 60 may serve as a passage for transporting separated charge carriers (e.g., electrons) from the active layer 30 to the cathode 20. Herein, a transporting direction of the charge carriers (e.g., electrons) may be the active layer 30, the auxiliary layer 60, and the cathode 20.

The auxiliary layer 60 includes a plurality of layers and includes a first auxiliary layer 60a and a second auxiliary layer 60b. The first auxiliary layer 60a may be closest to the active layer 30 and may be, in some example embodiments, in contact with the active layer 30. The second auxiliary layer 60b may be closest to the cathode 20 and may be, in some example embodiments, in contact with the cathode 20.

Figure 8:
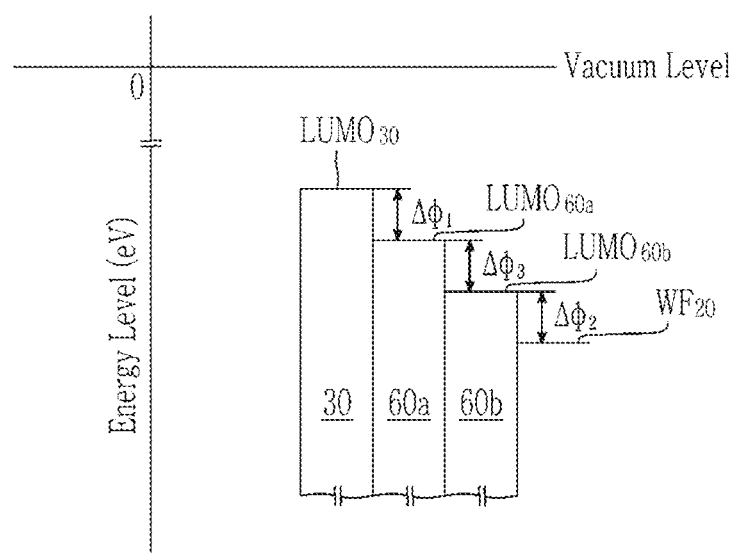
FIG. 8 is an energy diagram showing energy levels of the cathode, auxiliary layer, and active layer in the device shown in FIG. 7.

FIG. 8 is an energy diagram showing energy levels of the cathode 20, the auxiliary layer 60, and the active layer 30 in the device shown in FIG. 7, Referring to FIG. 8, separated electrons in the active layer 30 may be transported along the LUMO energy level to the cathode 20, in some example embodiments, along the LUMO energy level ($LUMO_{30}$) of the active layer 30, the LUMO energy level ($LUMO_{60a}$) of the first auxiliary layer 60a, the LUMO energy level ($LUMO_{60b}$) of the second auxiliary layer 60b, and the work function ($WF_{20}$) of the cathode 20.

Herein, the LUMO energy level ($LUMO_{30}$) of the active layer 30, the LUMO energy level ($LUMO_{60a}$) of the first auxiliary layer 60a, the LUMO energy level ($LUMO_{60b}$) of the second auxiliary layer 60b, and the work function ($WF_{20}$) of the cathode 20 may become deeper sequentially from a vacuum level, in some example embodiments, the LUMO energy level ($LUMO_{30}$) of the active layer 30 may be the shallowest, the work function ($WF_{20}$) of the cathode 20 may be the deepest, the LUMO energy level ($LUMO_{60a}$) of the first auxiliary layer 60a and the LUMO energy level ($LUMO_{60b}$) of the second auxiliary layer 60b may be between the LUMO energy level ($LUMO_{30}$) of the active layer 30 and the work function ($WF_{20}$) of the cathode 20. As a result, the magnitude of the LUMO energy level ($LUMO_{60a}$) of the first auxiliary layer 60a may be between the magnitude of the LUMO energy level ($LUMO_{30}$) of the active layer 30 and the magnitude of the LUMO energy level ($LUMO_{60b}$) of the second auxiliary layer 60b, and the magnitude of the LUMO energy level ($LUMO_{60b}$) of the second auxiliary layer 60b may be between the magnitude of the LUMO energy level ($LUMO_{60a}$) of the first auxiliary layer 60a and the magnitude of the work function ($WF_{20}$) of the cathode 20. In other words, the LUMO energy level ($LUMO_{30}$) of the active layer 30, the LUMO energy level ($LUMO_{60a}$) of the first auxiliary layer 60a, the LUMO energy level ($LUMO_{60b}$) of the second auxiliary layer 60b, and the work function ($WF_{20}$) of the cathode 20 may have a cascading energy level.

In some example embodiments, the LUMO energy level ($LUMO_{30}$) of the active layer 30, the LUMO energy level ($LUMO_{60a}$) of the first auxiliary layer 60a, the LUMO energy level ($LUMO_{60b}$) of the second auxiliary layer 60b, and the work function ($WF_{20}$) of the cathode 20 may have a stepwise shape.

A particular (or, alternatively, predetermined) energy barrier may be present between adjacent layers, and herein, the energy barrier may include an energy barrier ($\Delta\phi_1$) between the active layer 30 and the first auxiliary layer 60a, an energy barrier ($\Delta\phi_2$) between the second auxiliary layer 60b and the cathode 20, and an energy barrier ($\Delta\phi_3$) between the first auxiliary layer 60a and the second auxiliary layer 60b. The energy barrier ($\Delta\phi_1$) may be a difference between the LUMO energy level ($LUMO_{30}$) of the active layer 30 and the LUMO energy level ($LUMO_{60a}$) of the first auxiliary layer 60a, the energy barrier ($\Delta\phi_2$) may be a difference between the LUMO energy level ($LUMO_{60b}$) of the second auxiliary layer 60b and the work function ($WF_{20}$) of the cathode 20, and the energy barrier ($\Delta\phi_3$) may be a difference between the LUMO energy level ($LUMO_{60a}$) of the first auxiliary layer 60a and the LUMO energy level ($LUMO_{60b}$) of the second auxiliary layer 60b.

Each energy barrier ($\Delta\phi_1$, $\Delta\phi_2$, and $\Delta\phi_3$) between the adjacent layers may have a small difference and/or be substantially equal.

In some example embodiments, the energy barrier ($\Delta\phi_1$) between the active layer 30 and the first auxiliary layer 60a and the energy barrier ($\Delta\phi_2$) between the second auxiliary layer 60b and the cathode 20 may have a very small difference and/or be substantially equal. In some example embodiments, the energy diagrams of the active layer 30, the first auxiliary layer 60a, the second auxiliary layer 60b and the cathode 20 may satisfy Relationship Equation 1.

$$|\Delta\phi_1 - \Delta\phi_2| \leq 0.1 \text{ eV} \qquad \text{[Relationship Equation 1]}$$

In some example embodiments, the energy barrier ($\Delta\phi_1$) between the active layer 30 and the first auxiliary layer 60a and the energy barrier ($\Delta\phi_3$) between the first auxiliary layer 60a and the second auxiliary layer 60b may have a small difference and/or be substantially equal. In some example embodiments, the energy diagrams of the active layer 30, the first auxiliary layer 60a, and the second auxiliary layer 60b may satisfy Relationship Equation 2.

$$|\Delta\phi_1 - \Delta\phi_3| \leq 0.1 \text{ eV} \qquad \text{[Relationship Equation 2]}$$

In some example embodiments, the energy barrier ($\Delta\phi_3$) between the first auxiliary layer 60a and the second auxiliary layer 60b and the energy barrier ($\Delta\phi_2$) between the second auxiliary layer 60b and the cathode 20 may have a small difference and/or be substantially equal. In some example embodiments, the energy diagrams of the first auxiliary layer 60a, the second auxiliary layer 60b, and the cathode 20 may satisfy Relationship Equation 3.

$$|\Delta\phi_3 - \Delta\phi_2| \leq 0.1 \text{ eV} \qquad \text{[Relationship Equation 3]}$$

In some example embodiments, the energy barrier ($\Delta\phi_1$) between the active layer 30 and the first auxiliary layer 60a, the energy barrier ($\Delta\phi_2$) between the second auxiliary layer 60b and the cathode 20, and the energy barrier ($\Delta\phi_3$) between the first auxiliary layer 60a and the second auxiliary layer 60b may have a small difference and/or be substantially equal. In some example embodiments, the energy diagrams of the active layer 30, the first auxiliary layer 60a, the second auxiliary layer 60b, and the cathode 20 may satisfy Relationship Equations 1, 2, and 3 simultaneously.

Based on the active layer 30, the first auxiliary layer 60a, the second auxiliary layer 60b, and the cathode 20 satisfying one or more of Relationship Equations 1, 2, or 3, the energy barriers ($\Delta\phi_1$, $\Delta\phi_2$, and $\Delta\phi_3$) between the active layer 30, the first auxiliary layer 60a, the second auxiliary layer 60b, and the cathode 20 may satisfy one or more of Relationship Equations 1, 2, or 3 and thus prevent an electron transport delay at the interface of the layers in a path through which electrons transport and thereby exhibit high charge extraction efficiency. In addition, undesirably remaining charge carriers at the interface between the adjacent layers may be reduced or prevented to reduce or prevent an after-image due to the accumulated remaining charge carriers. Therefore, electrical performance of the device 100, and/or a sensor, electronic device, or the like that includes the device 100, may be improved.

Within the range, the energy diagrams of the active layer 30, the first auxiliary layer 60a, the second auxiliary layer 60b, and the cathode 20 may satisfy Relationship Equations 1A, 2A, and/or 3A.

$0<|\Delta\phi_1-\Delta\phi_2|\leq 0.1$ eV [Relationship Equation 1A]

$0<|\Delta\phi_1-\Delta\phi_3|\leq 0.1$ eV [Relationship Equation 1A]

$0<|\Delta\phi_3-\Delta\phi_2|\leq 0.1$ eV [Relationship Equation 1A]

Within the range, the energy diagrams of the active layer 30, the first auxiliary layer 60a, the second auxiliary layer 60b, and the cathode 20 may satisfy Relationship Equations 1B, 2B, and/or 3B.

$|\Delta\phi_1-\Delta\phi_2|\leq 0.07$ eV [Relationship Equation 1B]

$|\Delta\phi_1-\Delta\phi_3|\leq 0.07$ eV [Relationship Equation 2B]

$|\Delta\phi_3-\Delta\phi_2|\leq 0.07$ eV [Relationship Equation 3B]

Within the range, the energy diagrams of the active layer 30, the first auxiliary layer 60a, the second auxiliary layer 60b, and the cathode 20 may satisfy Relationship Equations 1C, 2C, and/or 3C.

$0<|\Delta\phi_1-\Delta\phi_2|\leq 0.07$ eV [Relationship Equation 1C]

$0<|\Delta\phi_1-\Delta\phi_3|\leq 0.07$ eV [Relationship Equation 2C]

$0<|\Delta\phi_3-\Delta\phi_2|\leq 0.07$ eV [Relationship Equation 3C]

Within the range, the energy diagrams of the active layer 30, the first auxiliary layer 60a, the second auxiliary layer 60b, and the cathode 20 may satisfy Relationship Equations 1D, 2D, and/or 3D.

$|\Delta\phi_1-\Delta\phi_2|\leq 0.05$ eV [Relationship Equation 1D]

$|\Delta\phi_1-\Delta\phi_3|\leq 0.05$ eV [Relationship Equation 2D]

$|\Delta\phi_3-\Delta\phi_2|\leq 0.05$ eV [Relationship Equation 3D]

Within the range, the energy diagrams of the active layer 30, the first auxiliary layer 60a, the second auxiliary layer 60b, and the cathode 20 may satisfy Relationship Equations 1E, 2E, and/or 3E.

$0<|\Delta\phi_1-\Delta\phi_2|\leq 0.05$ eV [Relationship Equation 1E]

$0<|\Delta\phi_1-\Delta\phi_3|\leq 0.05$ eV [Relationship Equation 2E]

$0<|\Delta\phi_3-\Delta\phi_2|\leq 0.05$ eV [Relationship Equation 3E]

Within the range, the energy diagrams of the active layer 30, the first auxiliary layer 60a, the second auxiliary layer 60b, and the cathode 20 may satisfy Relationship Equations 1F, 2F, and/or 3F.

$|\Delta\phi_1-\Delta\phi_2|\leq 0.03$ eV [Relationship Equation 1F]

$|\Delta\phi_1-\Delta\phi_3|\leq 0.03$ eV [Relationship Equation 2F]

$|\Delta\phi_3-\Delta\phi_2|\leq 0.03$ eV [Relationship Equation 3F]

Within the range, the energy diagrams of the active layer 30, the first auxiliary layer 60a, the second auxiliary layer 60b, and the cathode 20 may satisfy Relationship Equations 1G, 2G, and/or 3G.

$0<|\Delta\phi_1-\Delta\phi_2|\leq 0.03$ eV [Relationship Equation 1G]

$0<|\Delta\phi_1-\Delta\phi_3|\leq 0.03$ eV [Relationship Equation 2G]

$0<|\Delta\phi_3-\Delta\phi_2|\leq 0.03$ eV [Relationship Equation 3G]

Within the range, the energy diagrams of the active layer 30, the first auxiliary layer 60a, the second auxiliary layer 60b, and the cathode 20 may satisfy Relationship Equations 1H, 2H, and/or 3H.

$|\Delta\phi_1-\Delta\phi_2|\leq 0.01$ eV [Relationship Equation 1H]

$|\Delta\phi_1-\Delta\phi_3|\leq 0.01$ eV [Relationship Equation 2H]

$|\Delta\phi_3-\Delta\phi_2|\leq 0.01$ eV [Relationship Equation 3H]

Within the range, the energy diagrams of the active layer 30, the first auxiliary layer 60a, the second auxiliary layer 60b, and the cathode 20 may satisfy Relationship Equations 1I, 2I and/or 3I.

$0<|\Delta\phi_1-\Delta\phi_2|\leq 0.01$ eV [Relationship Equation 1I]

$0<|\Delta\phi_1-\Delta\phi_3|\leq 0.01$ eV [Relationship Equation 2I]

$0<|\Delta\phi_3-\Delta\phi_2|\leq 0.01$ eV [Relationship Equation 3I]

In some example embodiments, the energy barriers ($\Delta\phi_1$, $\Delta\phi_2$, and $\Delta\phi_3$) may be each less than or equal to about 0.5 eV and within the range, less than or equal to about 0.4 eV, less than or equal to about 0.3 eV, or less than or equal to about 0.25 eV. In some example embodiments, the energy barriers ($\Delta\phi_1$, $\Delta\phi_2$, and $\Delta\phi_3$) may be independently about 0.105 eV to about 0.25 eV and within the range, about 0.15 eV to about 0.25 eV, about 0.18 eV to about 0.25 eV, or about 0.20 eV to about 0.25 eV.

The first auxiliary layer 60a and the second auxiliary layer 60b may independently have each thickness of less than or equal to about 10 nm, for example less than or equal to about 8 nm, less than or equal to about 7 nm, less than or equal to about 5 nm, or less than or equal to about 3 nm.

The first auxiliary layer 60a and the second auxiliary layer 60b may include an organic material, an inorganic material, and/or an organic/inorganic material, respectively. In some example embodiments, at least one of the first auxiliary layer 60a or the second auxiliary layer 60b may include an organic material. In some example embodiments, the first auxiliary layer 60a and the second auxiliary layer 60b may each include an organic material.

The hole buffer layer 70 is between the anode 10 and the active layer 30 and may transport separated charge carriers (e.g., holes) in the active layer 30 to the anode 10. Herein, a transporting direction of the charge carriers (e.g., holes) may be the active layer 30, the hole buffer layer 70, and the anode 10. In some example embodiments, the hole buffer layer 70 may be in contact with the active layer 30. In some example embodiments, one surface of the hole buffer layer 70 may be in contact with the active layer 30 and the other surface of the hole buffer layer 70 may be in contact with the anode 10.

The hole buffer layer 70 may be a very thin film of several nanometers thickness, and may have, in some example embodiments, a thickness of less than or equal to about 8 nm, less than or equal to about 7 nm, or less than or equal to about 5 nm. The hole buffer layer 70 may have, in some example embodiments, a thickness of about 1 nm to about 8 nm, about 1 nm to about 7 nm, or about 1 nm to about 5 nm.

The hole buffer layer 70 may include, in some example embodiments, an organic material, an inorganic material, and/or an organic/inorganic material.

In some example embodiments, the hole buffer layer 70 may include an organic material.

In some example embodiments, the hole buffer layer 70 may include, in some example embodiments, a compound represented by Chemical Formula 4A or 4B, but is not limited thereto.

[Chemical Formula 4A]

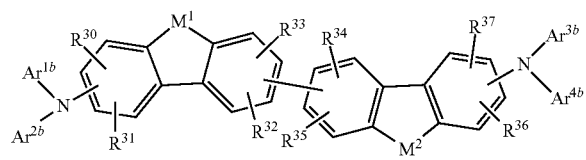

[Chemical Formula 4B]

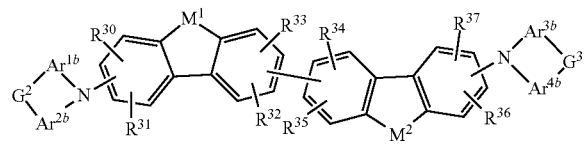

In Chemical Formula 4A or 4B, $M^1$ and $M^2$ are independently $CR''R^o$, $SiR^pR^q$, $NR'$O, S, Se, or Te, $Ar^{1b}$, $Ar^{2b}$, $Ar^{3b}$, and $Ar^{4b}$ are independently a substituted or unsubstituted C6 to C30 aryl group or a substituted or unsubstituted C3 to C30 heteroaryl group, $G^2$ and $G^3$ are independently a single bond, —(CR$^s$R$^t$)$_{n3}$—, —O—, —S—, —Se—, —N=, —NR$^u$—, —SiR$^v$R$^w$—, or —GeR$^x$R$^y$—, wherein n3 is 1 or 2, and $R^{30}$ to $R^{37}$ and $R^n$ to $R^y$ are independently hydrogen, a substituted or unsubstituted C1 to C30 alkyl group, a substituted or unsubstituted C6 to C30 aryl group, a substituted or unsubstituted C3 to C30 heterocyclic group, a substituted or unsubstituted C1 to C6 alkoxy group, a halogen, or a cyano group.

In some example embodiments, the hole buffer layer 70 may be a compound represented by Chemical Formula 4A-1 or 4B-1, but is not limited thereto.

[Chemical Formula 4A-1]

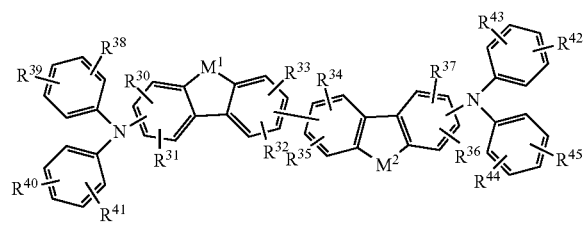

[Chemical Formula 4B-1]

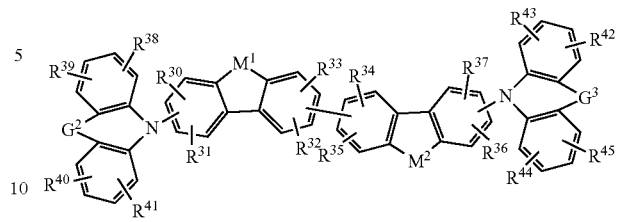

In Chemical Formula 4A-1 or 4B-1, $M^1$, $M^2$, $G^2$, $G^3$, and $R^{30}$ to $R^{37}$ are the same as described above, and $R^{38}$ to $R^{45}$ are independently hydrogen, a substituted or unsubstituted C1 to C30 alkyl group, a substituted or unsubstituted C6 to C30 aryl group, a substituted or unsubstituted C3 to C30 heteroaryl group, a substituted or unsubstituted C1 to C6 alkoxy group, a halogen, or a cyano group.

In some example embodiments, the hole buffer layer 70 may be a compound represented by Chemical Formula 4A-1a or 4B-1a, but is not limited thereto.

[Chemical Formula 4A-1a]

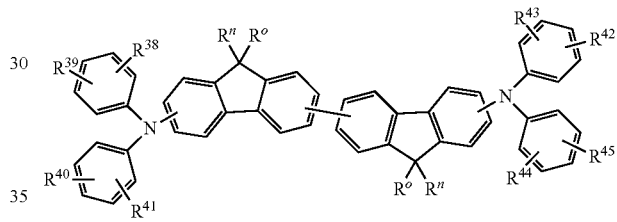

[Chemical Formula 4B-1a]

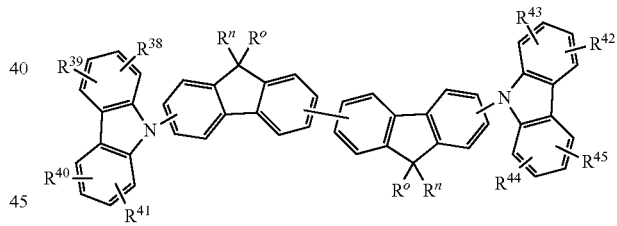

In Chemical Formula 4A-1a or 4B-1a, $R^{38}$ to $R^{45}$, $R^o$, and $R^n$ are the same as described above.

In FIG. 7, the hole buffer layer 70 is shown as a single layer but is not limited thereto and includes at least two layers. In some example embodiments, the hole buffer layer 70 may include a first hole buffer layer (not shown) and a second hole buffer layer (not shown), and in some example embodiments, the first hole buffer layer may be formed to be close to the active layer 30, in some example embodiments, to be in contact with the active layer 30, and the second hole buffer layer may be formed to be the closest to the anode 10, in some example embodiments, to be in contact with the anode 10. In some example embodiments, energy level differences between the active layer 30, the first hole buffer layer, the second hole buffer layer, and the anode may be very small and/or be substantially equal. In some example embodiments, the HOMO energy level difference between the active layer 30, the first hole buffer layer, the second hole buffer layer, and the anode 10 may satisfy Relationship Equations 7, 8, and/or 9 like the LUMO energy level differences between the active layer 30, the first electron buffer layer 50a, the second electron buffer layer 50b, and the cathode 20 as shown in FIGS. 5 and 6.

In some example embodiments, the hole buffer layer 70 may be omitted.

The device 100 may further include an anti-reflective layer (not shown) on the anode 10 or the cathode 20. The anti-reflective layer is the same as described above.

The device 100 may internally generate excitons, when light is incident through the anode 10 or the cathode 20 and the active layer 30 may be configured to absorb light of a particular (or, alternatively, predetermined) wavelength spectrum. The excitons may be separated into electrons and holes in the active layer 30, and the separated electrons may be transported to the cathode 20 through the first auxiliary layer 60a and the second auxiliary layer 60b, while the separated holes may be transported to the anode 10 through the hole buffer layer 70, so as to flow a current.

Figure 9:
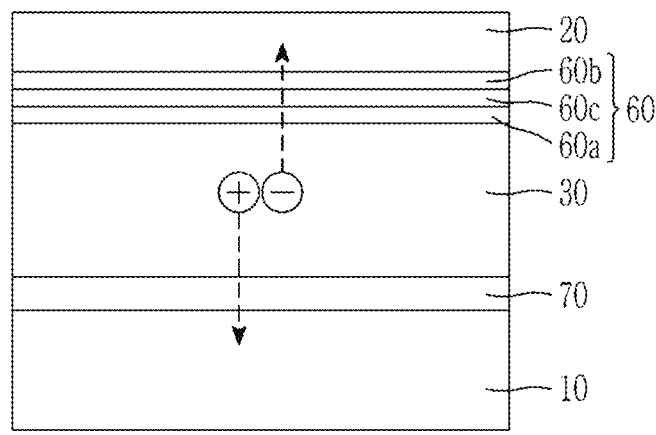
FIG. 9 is a cross-sectional view showing a device according to some example embodiments.

FIG. 9 is a cross-sectional view showing a device according to some example embodiments.

Referring to FIG. 9, the device 100 includes, like some example embodiments, including the example embodiments shown in FIGS. 1-2, the anode 10 and the cathode 20 facing each other; the active layer 30 between the anode 10 and the cathode 20; the auxiliary layer 60 between the cathode 20 and the active layer 30; and the hole buffer layer 70 between the anode 10 and the active layer 30. Each constituent element is the same as described above.

Figure 10:
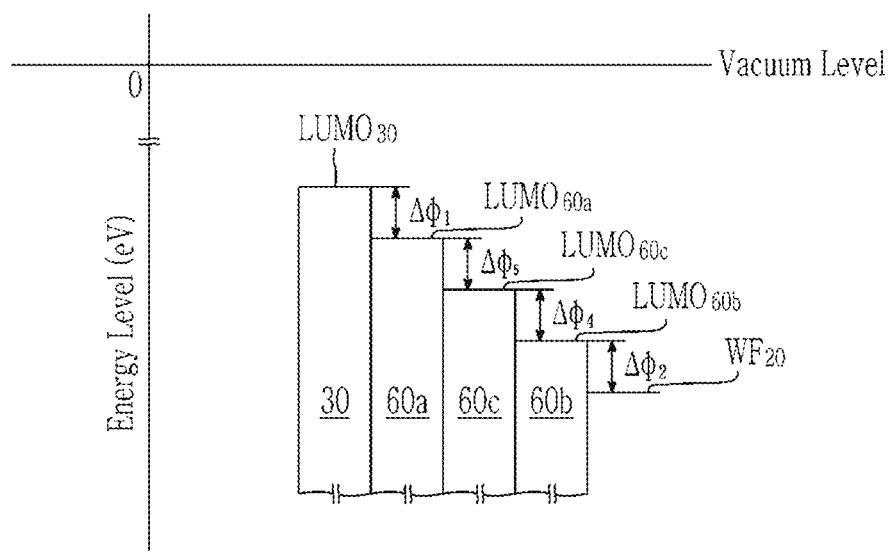
FIG. 10 is an energy diagram showing energy levels of the cathode, auxiliary layer and active layer in the device shown in FIG. 9.

However in some example embodiments including the example embodiments shown in FIGS. 9-10, unlike some example embodiments, including the example embodiments shown in FIGS. 1-2, the auxiliary layer 60 may further include a third auxiliary layer 60c, in addition to the first auxiliary layer 60a and the second auxiliary layer 60b. The third auxiliary layer 60c may be between the first auxiliary layer 60a and the second auxiliary layer 60b, in some example embodiments, one surface of the third auxiliary layer 60c may be in contact with the first auxiliary layer 60a, and the other surface of the third auxiliary layer 60c may be in contact with the second auxiliary layer 60b.

The auxiliary layer 60 may have a structure of sequentially stacking the first auxiliary layer 60a, the third auxiliary layer 60c, and the second auxiliary layer 60b, and accordingly, a transporting direction of separated charge carriers (e.g., electrons) in the active layer 30 is the active layer 30, the first auxiliary layer 60a, the third auxiliary layer 60c, the second auxiliary layer 60b, and the cathode 20.

FIG. 10 is an energy diagram showing energy levels of the cathode 20, the auxiliary layer 60, and the active layer 30 in the device of FIG. 9.

Referring to FIG. 10, separated electrons in the active layer 30 may be transferred along the LUMO energy level to the cathode 20, in some example embodiments, along the LUMO energy level ($LUMO_{30}$) of the active layer 30, the LUMO energy level ($LUMO_{60a}$) of the first auxiliary layer 60a, the LUMO energy level ($HOMO_{60c}$) of the third auxiliary layer 60c, the LUMO energy level ($HOMO_{60b}$) of the second auxiliary layer 60b, and the work function ($WF_{20}$) of the cathode 20.

Herein, the LUMO energy level ($LUMO_{30}$) of the active layer 30, the LUMO energy level ($LUMO_{60a}$) of the first auxiliary layer 60a, the LUMO energy level ($HOMO_{60c}$) of the third auxiliary layer 60c, the LUMO energy level ($LUMO_{60b}$) of the second auxiliary layer 60b, and the work function ($WF_{20}$) of the cathode 20 may become deeper sequentially, in some example embodiments, the LUMO energy level ($LUMO_{30}$) of the active layer 30 may be the shallowest, the work function ($WF_{20}$) of the cathode 20 may be the deepest, and the LUMO energy level ($LUMO_{60a}$) of the first auxiliary layer 60a, the LUMO energy level ($HOMO_{60c}$) of the third auxiliary layer 60c, and the LUMO energy level ($LUMO_{60b}$) of the second auxiliary layer 60b may be present between the LUMO energy level ($LUMO_{30}$) of the active layer 30 and the work function ($WF_{20}$) of the cathode 20. In other words, the LUMO energy level ($LUMO_{30}$) of the active layer 30, the LUMO energy level ($LUMO_{60a}$) of the first auxiliary layer 60a, the LUMO energy level ($HOMO_{60c}$) of the third auxiliary layer 60c, the LUMO energy level ($LUMO_{60b}$) of the second auxiliary layer 60b, and the work function ($WF_{20}$) of the cathode 20 may have a cascading energy level.

In some example embodiments, the LUMO energy level ($LUMO_{30}$) of the active layer 30, the LUMO energy level ($LUMO_{60a}$) of the first auxiliary layer 60a, the LUMO energy level ($HOMO_{60c}$) of the third auxiliary layer 60c, the LUMO energy level ($LUMO_{60b}$) of the second auxiliary layer 60b, and the work function ($WF_{20}$) of the cathode 20 may have a stepwise shape.

In some example embodiments, a particular (or, alternatively, predetermined) energy barrier may be present between the adjacent layers, and herein, the energy barriers may include an energy barrier ($\Delta\phi_1$) between the active layer 30 and the first auxiliary layer 60a, an energy barrier ($\Delta\phi_2$) between the second auxiliary layer 60b and the cathode 20, an energy barrier ($\Delta\phi_4$) between the third auxiliary layer 60c and the second auxiliary layer 60b, and an energy barrier ($\Delta\phi_5$) between the first auxiliary layer 60a and the third auxiliary layer 60c. The energy barrier ($\Delta\phi_1$) may be a difference between the LUMO energy level ($LUMO_{30}$) of the active layer 30 and the LUMO energy level ($LUMO_{60a}$) of the first auxiliary layer 60a, the energy barrier ($\Delta\phi_2$) may be a difference between the LUMO energy level ($LUMO_{60b}$) of the second auxiliary layer 60b and the work function ($WF_{20}$) of the cathode 20, the energy barrier ($\Delta\phi_4$) may be a difference between the LUMO energy level ($HOMO_{60c}$) of the third auxiliary layer 60c and the LUMO energy level ($LUMO_{60b}$) of the second auxiliary layer 60b, and the energy barrier ($\Delta\phi_5$) may be a difference between LUMO energy level ($LUMO_{60a}$) of the first auxiliary layer 60a and the LUMO energy level ($HOMO_{60c}$) of the third auxiliary layer 60c.

The energy barriers ($\Delta\phi_1$, $\Delta\phi_2$, $\Delta\phi_4$, and $\Delta\phi_5$) between the adjacent layers may have a very small difference and/or be substantially equal.

In some example embodiments, the energy barrier ($\Delta\phi_1$) between the active layer 30 and the first auxiliary layer 60a and the energy barrier ($\Delta\phi_2$) between the second auxiliary layer 60b and the cathode 20 may have a very small difference and/or be substantially equal. In some example embodiments, the energy diagrams of the active layer 30, the first auxiliary layer 60a, the second auxiliary layer 60b, and the cathode 20 may satisfy Relationship Equation 1.

In some example embodiments, the energy barrier ($\Delta\phi_2$) between the second auxiliary layer 60b and the cathode 20 and the energy barrier ($\Delta\phi_4$) between the third auxiliary layer 60c and the second auxiliary layer 60b may have a very small difference and/or be substantially, be equal. In some example embodiments, the energy diagrams of the third auxiliary layer 60c, the second auxiliary layer 60b, and the cathode 20 may satisfy Relationship Equation 4.

$$|\Delta\phi_2-\Delta\phi_4|\leq 0.1\ eV \qquad \text{[Relationship Equation 4]}$$

In some example embodiments, the energy barrier ($\Delta\phi_1$) between the active layer 30 and the first auxiliary layer 60a and the energy barrier ($\Delta\phi_5$) between the first auxiliary layer 60a and the third auxiliary layer 60c may have a small difference and/or be substantially, be equal. In some example embodiments, the energy diagrams of the active layer 30, the first auxiliary layer 60a, and the third auxiliary layer 60c may satisfy Relationship Equation 5.

$|\Delta\phi_1-\Delta\phi_5|\leq 0.1$ eV [Relationship Equation 5]

In some example embodiments, the energy barrier ($\Delta\phi_4$) between the second auxiliary layer 60b and the third auxiliary layer 60c and the energy barrier ($\Delta\phi_5$) between the first auxiliary layer 60a and the third auxiliary layer 60c may have a small difference and/or be substantially equal. In some example embodiments, the energy diagrams of the first auxiliary layer 60a, the third auxiliary layer 60c, and the second auxiliary layer 60b may satisfy Relationship Equation 6.

$|\Delta\phi_4-\Delta\phi_5|\leq 0.1$ eV [Relationship Equation 6]

In some example embodiments, the energy barrier ($\Delta\phi_1$) between the active layer 30 and the first auxiliary layer 60a, the energy barrier ($\Delta\phi_2$) between the second auxiliary layer 60b and the cathode 20, the energy barrier ($\Delta\phi_4$) between the third auxiliary layer 60c and the second auxiliary layer 60b, and the energy barrier ($\Delta\phi_5$) between the first auxiliary layer 60a and the third auxiliary layer 60c may have a very small difference and/or be substantially equal. In some example embodiments, the energy diagrams of the active layer 30, the first auxiliary layer 60a, the third auxiliary layer 60c, the second auxiliary layer 60b, and the cathode 20 may simultaneously satisfy Relationship Equations 4, 5, and 6.

Based on the active layer 30, the first auxiliary layer 60a, the third auxiliary layer 60c, the second auxiliary layer 60b, and the cathode 20 satisfying one or more of Relationship Equations 4, 5, or 6, the energy barriers ($\Delta\phi_1$, $\Delta\phi_2$, $\Delta\phi_4$, and $\Delta\phi_5$) of the active layer 30, the first auxiliary layer 60a, the third auxiliary layer 60c, the second auxiliary layer 60b, and the cathode 20 may satisfy one or more of Relationship Equations 4, 5, or 6 and accordingly, may prevent a hole transport delay at the interface of the layers present in a path through which electrons transport and thus exhibit high charge extraction efficiency. In addition, undesirably remaining charge carriers remaining at the interface between the adjacent layers may be reduced or prevented to reduce or prevent an after-image d due to the accumulated remaining charge carriers. Therefore, electrical performance of the device 100, and/or a sensor, electronic device, or the like that includes the device 100, may be improved.

Within the range, the energy diagrams of the active layer 30, the first auxiliary layer 60a, the third auxiliary layer 60c, the second auxiliary layer 60b, and the cathode 20 may satisfy Relationship Equations 4A, 5A, and/or 6A.

$0<|\Delta\phi_2-\Delta\phi_4|\leq 0.1$ eV [Relationship Equation 4A]

$0<|\Delta\phi_1-\Delta\phi_5|\leq 0.1$ eV [Relationship Equation 5A]

$0<|\Delta\phi_4-\Delta\phi_5|\leq 0.1$ eV [Relationship Equation 6A]

Within the range, the energy diagrams of the active layer 30, the first auxiliary layer 60a, the third auxiliary layer 60c, the second auxiliary layer 60b, and the cathode 20 may satisfy Relationship Equations 4B, 5B, and/or 6B.

$|\Delta\phi_2-\Delta\phi_4|\leq 0.7$ eV [Relationship Equation 4B]

$|\Delta\phi_1-\Delta\phi_5|\leq 0.7$ eV [Relationship Equation 5B]

$|\Delta\phi_4-\Delta\phi_5|\leq 0.7$ eV [Relationship Equation 6B]

Within the range, the energy diagrams of the active layer 30, the first auxiliary layer 60a, the third auxiliary layer 60c, the second auxiliary layer 60b, and the cathode 20 may satisfy Relationship Equations 4C, 5C, and/or 6C.

$0<|\Delta\phi_2-\Delta\phi_4|\leq 0.7$ eV [Relationship Equation 4C]

$0<|\Delta\phi_1-\Delta\phi_5|\leq 0.7$ eV [Relationship Equation 5C]

$0<|\Delta\phi_4-\Delta\phi_5|\leq 0.7$ eV [Relationship Equation 6C]

Within the range, the energy diagrams of the active layer 30, the first auxiliary layer 60a, the third auxiliary layer 60c, the second auxiliary layer 60b, and the cathode 20 may satisfy Relationship Equations 4D, 5D, and/or 6D.

$|\Delta\phi_2-\Delta\phi_4|\leq 0.05$ eV [Relationship Equation 4D]

$|\Delta\phi_1-\Delta\phi_5|\leq 0.05$ eV [Relationship Equation 5D]

$|\Delta\phi_4-\Delta\phi_5|\leq 0.05$ eV [Relationship Equation 6D]

Within the range, the energy diagrams of the active layer 30, the first auxiliary layer 60a, the third auxiliary layer 60c, the second auxiliary layer 60b, and the cathode 20 may satisfy Relationship Equations 4E, 5E, and/or 6E.

$0<|\Delta\phi_2-\Delta\phi_4|\leq 0.05$ eV [Relationship Equation 4E]

$0<|\Delta\phi_1-\Delta\phi_5|\leq 0.05$ eV [Relationship Equation 5E]

$0<|\Delta\phi_4-\Delta\phi_5|\leq 0.05$ eV [Relationship Equation 6E]

Within the range, the energy diagrams of the active layer 30, the first auxiliary layer 60a, the third auxiliary layer 60c, the second auxiliary layer 60b, and the cathode 20 may satisfy Relationship Equations 4F, 5F, and/or 6F.

$|\Delta\phi_2-\Delta\phi_4|\leq 0.03$ eV [Relationship Equation 4F]

$|\Delta\phi_1-\Delta\phi_5|\leq 0.03$ eV [Relationship Equation 5F]

$|\Delta\phi_4-\Delta\phi_5|\leq 0.03$ eV [Relationship Equation 6F]

Within the range, the energy diagrams of the active layer 30, the first auxiliary layer 60a, the third auxiliary layer 60c, the second auxiliary layer 60b, and the cathode 20 may satisfy Relationship Equations 4G, 5G, and/or 6G.

$0<|\Delta\phi_2-\Delta\phi_4|\leq 0.03$ eV [Relationship Equation 4G]

$0<|\Delta\phi_1-\Delta\phi_5|\leq 0.03$ eV [Relationship Equation 5G]

$0<|\Delta\phi_4-\Delta\phi_5|\leq 0.03$ eV [Relationship Equation 6G]

Within the range, the energy diagrams of the active layer 30, the first auxiliary layer 60a, the third auxiliary layer 60c, the second auxiliary layer 60b, and the cathode 20 may satisfy Relationship Equations 4H, 5H, and/or 6H.

$|\Delta\phi_2-\Delta\phi_4|\leq 0.01$ eV [Relationship Equation 4H]

$|\Delta\phi_1-\Delta\phi_5|\leq 0.01$ eV [Relationship Equation 5H]

$|\Delta\phi_4-\Delta\phi_5|\leq 0.01$ eV [Relationship Equation 6H]

Within the range, the energy diagrams of the active layer 30, the first auxiliary layer 60a, the third auxiliary layer 60c, the second auxiliary layer 60b, and the cathode 20 may satisfy Relationship Equations 4I, 5I, and/or 6I.

$0<|\Delta\phi_2-\Delta\phi_4|\leq 0.01$ eV [Relationship Equation 4I]

$0<|\Delta\phi_1-\Delta\phi_5|\leq 0.01$ eV [Relationship Equation 5I]

$0<|\Delta\phi_4-\Delta\phi_5|\leq 0.01$ eV [Relationship Equation 6I]

In some example embodiments, the energy barriers ($\Delta\phi_1$, $\Delta\phi_2$, $\Delta\phi_4$, and $\Delta\phi_5$) may be respectively less than or equal to about 0.5 eV and within the range, less than or equal to about 0.4 eV, less than or equal to about 0.3 eV, or less than or equal to about 0.25 eV. In some example embodiments, the energy barriers ($\Delta\phi_1$, $\Delta\phi_2$, $\Delta\phi_4$, and $\Delta\phi_5$) may be independently in a range of about 0.10 eV to about 0.25 eV and within the range, about 0.15 eV to about 0.25 eV, about 0.18 eV to about 0.25 eV, or about 0.20 eV to about 0.25 eV.

The first auxiliary layer 60a, the second auxiliary layer 60b, and the third auxiliary layer 60c may independently have each thickness of less than or equal to about 10 nm, for example less than or equal to about 8 nm, less than or equal to about 7 nm, less than or equal to about 5 nm, or less than or equal to about 3 nm.

The first auxiliary layer 60a, the second auxiliary layer 60b, and the third auxiliary layer 60c may include an organic material, an inorganic material, and/or an organic/inorganic material, respectively. In some example embodiments, at least one of the first auxiliary layer 60a, the second auxiliary layer 60b, or the third auxiliary layer 60c may include an organic material. In some example embodiments, the first auxiliary layer 60a, the second auxiliary layer 60b, and the third auxiliary layer 60c may each include an organic material.

The aforementioned device 100 may be applied to various electronic devices, including, for example, solar cells, light emitting devices, sensors, photodetectors, and/or photosensors, but is not limited thereto.

In some example embodiments, the device 100 may be applied to (e.g., included in) one or more sensors and the one or more sensors may be for example image sensors.

Hereinafter, an example of an image sensor to which the aforementioned device 100 is applied is described with reference to drawings. Herein, an organic CMOS image sensor is described as an example of the image sensor.

Figure 11:
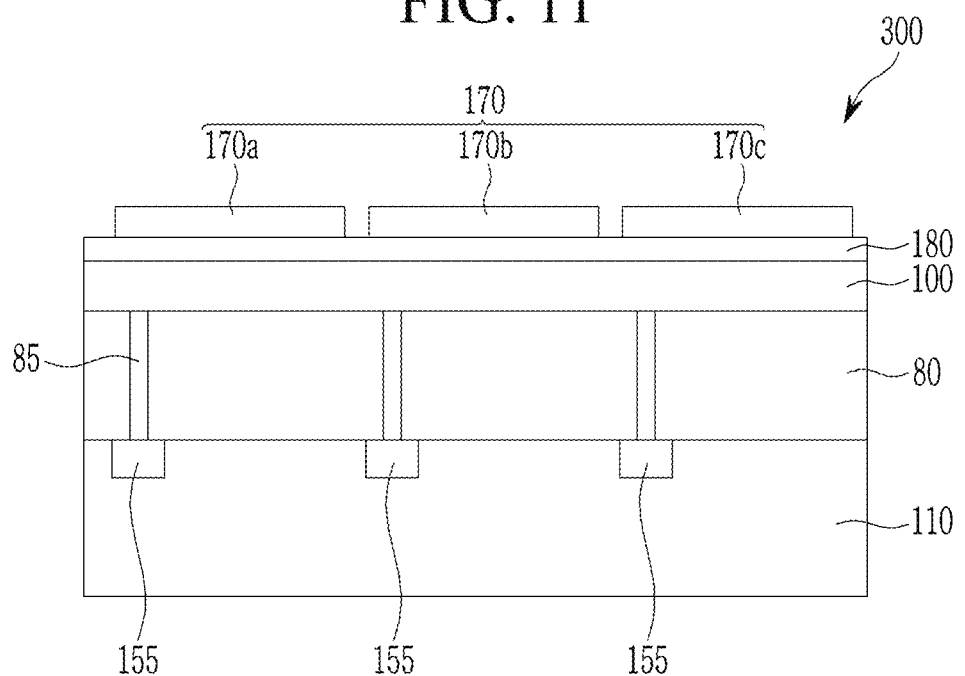
FIG. 11 is a schematic cross-sectional view of an example of an image sensor according to some example embodiments.

FIG. 11 is a schematic cross-sectional view of an example of an image sensor according to some example embodiments.

Referring to FIG. 11, an image sensor 300 according to some example embodiments includes a semiconductor substrate 110, an insulation layer 80, a device 100, and a color filter layer 170.

The semiconductor substrate 110 may be a silicon substrate, and is integrated with the transmission transistor (not shown) and the charge storage 155. The transmission transistor and/or charge storage 155 may be integrated for each pixel. The charge storage 155 is electrically connected to the device 100.

A metal wire (not shown) and a pad (not shown) are formed on the semiconductor substrate 110. In order to decrease signal delay, the metal wire and pad may be made of a metal having low resistivity, in some example embodiments, aluminum (Al), copper (Cu), silver (Ag), and alloys thereof, but are not limited thereto.

The insulation layer 80 is formed on the metal wire and the pad. The insulation layer 80 may be made of an inorganic insulating material such as a silicon oxide and/or a silicon nitride, or a low dielectric constant (low K) material such as SiC, SiCOH, SiCO, and SiOF. The insulation layer 80 has a trench 85 exposing the charge storage 155. The trench 85 may be filled with fillers.

The aforementioned device 100 is formed on the insulation layer 80. The device 100 may be one of the devices 100 shown in FIG. 1, 3, 5, 7, or 9. The device 100 may be a photoelectric conversion device. The specific description thereof is the same as described above. The anode 10 or cathode 20 of the device 100 may be connected to the charge storage 155.

The color filter layer 170 is formed on the device 100. The color filter layer 170 includes a blue filter 170a formed in a blue pixel, a red filter 170b formed in a red pixel, and a green filter 170c formed in a green pixel. However, the present disclosure is not limited thereto and may include a cyan filter, a magenta filter and/or a yellow filter instead or additionally.

An insulation layer 180 is formed between the device 100 and the color filter layer 170. The insulation layer 180 may be omitted.

Focusing lens (not shown) may be further formed on the color filter layer 170. The focusing lens may control a direction of incident light and gather the light in one region. The focusing lens may have a shape of, in some example embodiments, a cylinder or a hemisphere, but is not limited thereto.

Figure 12:
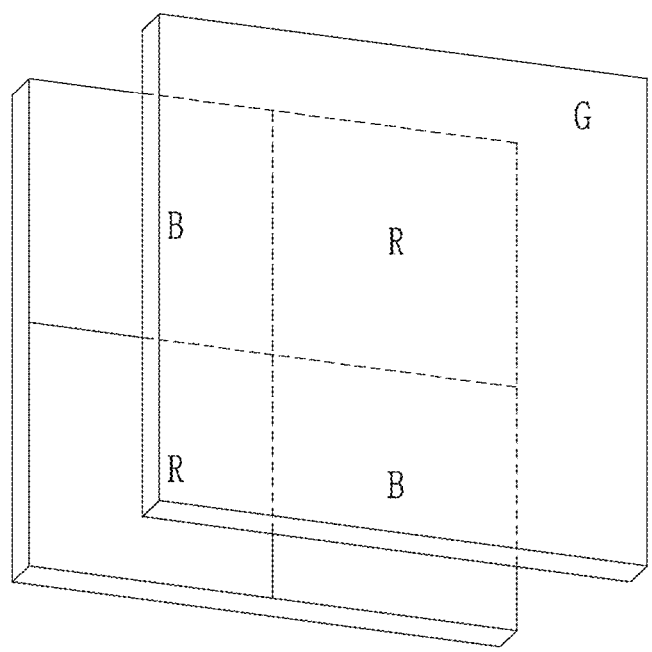
FIG. 12 is a top plan view schematically showing an image sensor according to some example embodiments.
Figure 13:
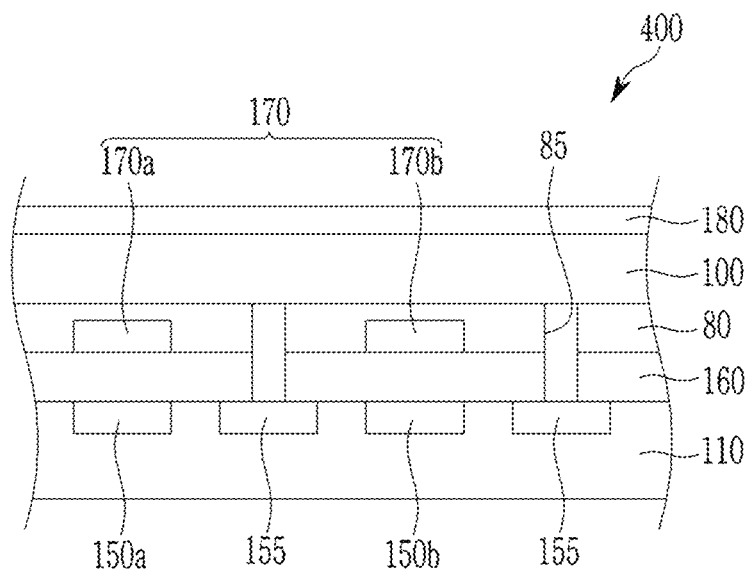
FIG. 13 is a cross-sectional view showing an example of the image sensor of FIG. 12.

FIG. 12 is a top plan view schematically showing an image sensor according to some example embodiments, and FIG. 13 is a cross-sectional view showing an example of the image sensor of FIG. 12.

Referring to FIGS. 12 and 13, an image sensor 400 according to some example embodiments includes a semiconductor substrate 110 integrated with photo-sensing devices 150a and 150b, a transmission transistor (not shown), and a charge storage 155, a lower insulation layer 160, a color filter layer 170, an upper insulation layer 80, and the aforementioned device 100. The aforementioned device 100 may be a photoelectric conversion device.

The semiconductor substrate 110 may be a silicon substrate, and is integrated with the photo-sensing devices 150a and 150b, the transmission transistor (not shown), and the charge storage 155. The photo-sensing devices 150a and 150b may be photodiodes.

The photo-sensing devices 150a and 150b and the transmission transistor, and/or the charge storage 155 may be integrated in each pixel. As shown in the drawing, the photo-sensing devices 150a and 150b may be included in the blue pixel and the red pixel, respectively. The charge storage 155 may be included in the green pixel.

The photo-sensing devices 150a and 150b may be configured to sense light and the sensed information may be transmitted by a transmission transistor. The charge storage 155 is electrically connected to the device 100 and the information of the charge storage 155 may be transmitted by a transmission transistor.

A metal wire (not shown) and a pad (not shown) are formed on the semiconductor substrate 110. In order to decrease signal delay, the metal wire and pad may be made of a metal having low resistivity, in some example embodiments, aluminum (Al), copper (Cu), silver (Ag), and alloys thereof, but are not limited thereto. Further, the present disclosure is not limited to the structure, and the metal wire and pad may be under the photo-sensing devices 150a and 150b.

The lower insulation layer 160 is formed on the metal wire and the pad. The lower insulation layer 160 may be made of an inorganic insulating material such as a silicon oxide and/or a silicon nitride, or a low dielectric constant (low K) material such as SiC, SiCOH, SiCO, and SiOF. The lower insulation layer 160 has a trench exposing the charge storage 155. The trench may be filled with fillers.

A color filter layer 170 is formed on the lower insulation layer 160. The color filter layer 170 includes a blue filter 170a formed in a blue pixel and a red filter 170b in a red pixel. In some example embodiments, a green filter is not included, but a green filter may be further included.

The upper insulation layer 80 is formed on the color filter layer 170. The upper insulation layer 80 may eliminate a step caused by the color filter layer 170 and smoothen the surface. The upper insulation layer 80 and the lower insulation layer 160 may include a contact hole (not shown) exposing a pad, and a through-hole (e.g., trench 85).

The aforementioned device 100 is formed on the upper insulation layer 80. The device 100 may be one of the devices 100 shown in FIG. 1, 3, 5, 7, or 9. The device 100 may be a photoelectric conversion device and specific descriptions therefore are the same as described above. The anode 10 or the cathode 20 of the device 100 may be connected to the charge storage 155.

Focusing lens (not shown) may be further formed on the device 100. The focusing lens may control a direction of incident light and gather the light in one region. The focusing lens may have a shape of, in some example embodiments, a cylinder or a hemisphere, but is not limited thereto.

Figure 14:
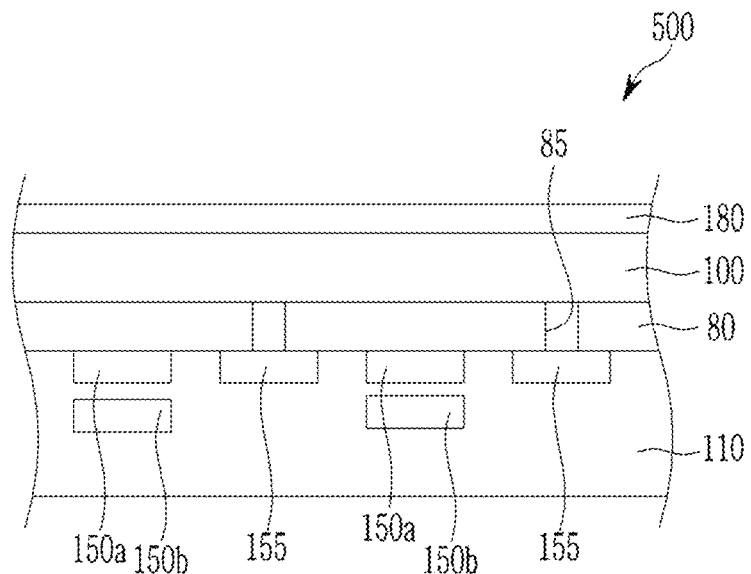
FIG. 14 is a cross-sectional view showing an image sensor according to some example embodiments.

FIG. 14 is a cross-sectional view showing an image sensor according to some example embodiments.

Referring to FIG. 14, like some example embodiments, including the example embodiments shown in FIGS. 12-13, the image sensor 500 according to some example embodiments includes a semiconductor substrate 110 integrated with photo-sensing devices 150a and 150b, a transmission transistor (not shown), and a charge storage 155, a lower insulation layer 160, a color filter layer 170, an upper insulation layer 80, and a device 100.

However, unlike some example embodiments, including the example embodiments shown in FIGS. 12-13, in the image sensor 500 according to some example embodiments, including the example embodiments shown in FIG. 14, the photo-sensing devices 150a and 150b are stacked in the vertical direction and the color filter layer 170 is omitted. The photo-sensing devices 150a and 150b are electrically connected to the charge storage (not shown) and information may be transmitted by a transmission transistor. The photo-sensing devices 150a and 150b may selectively absorb light in each wavelength spectrum depending on a stacking depth.

The device 100 may be the device 100 shown in FIG. 1, 3, 5, 7, or 9. The device 100 may be a photoelectric conversion device. The specific description thereof is the same as described above. The anode 10 or cathode 20 of the device 100 may be connected to the charge storage 155.

Figure 15:
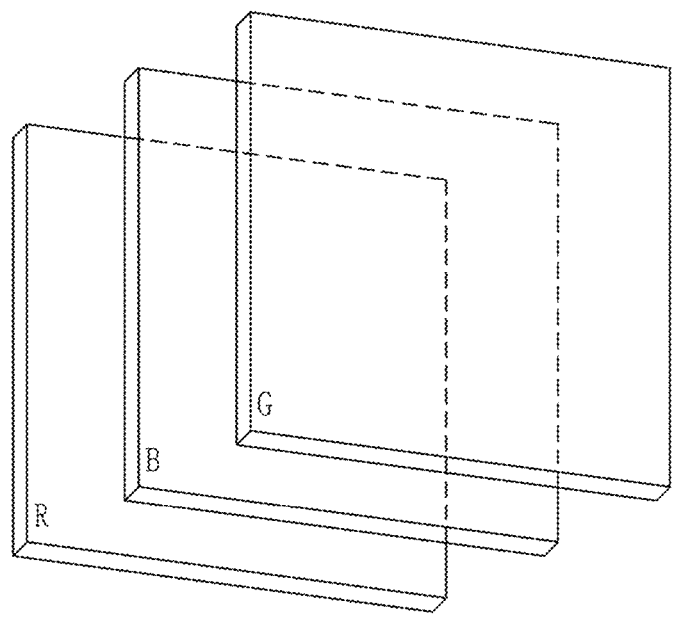
FIG. 15 is a top plan view schematically showing an image sensor according to some example embodiments.
Figure 16:
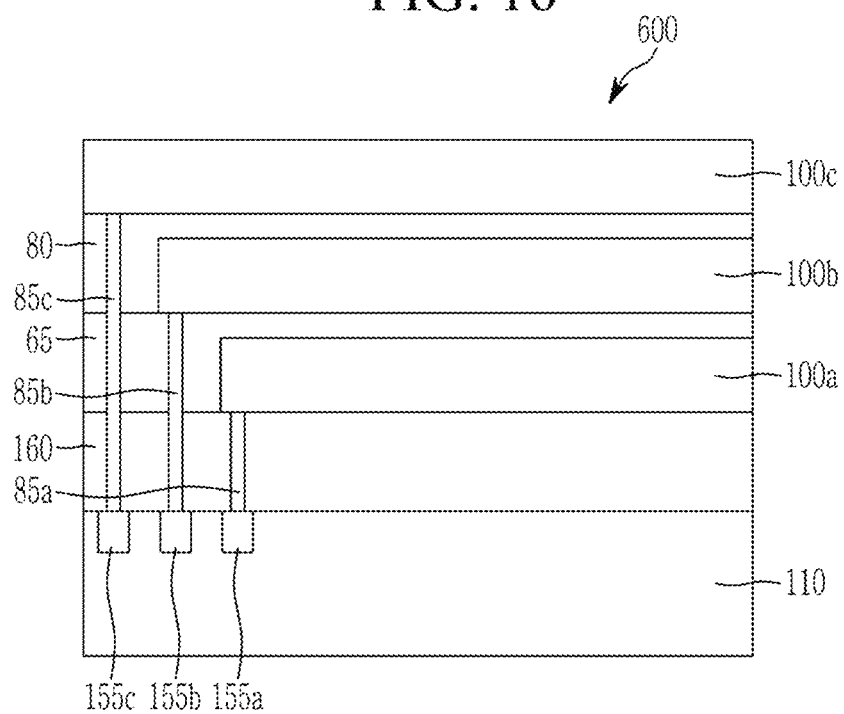
FIG. 16 is a cross-sectional view of the image sensor shown in FIG. 15.

FIG. 15 is a top plan view schematically showing an image sensor according to some example embodiments and FIG. 16 is a cross-sectional view of the image sensor FIG. 15.

The image sensor 600 according to some example embodiments has a structure in which a green device configured to selectively absorb light in a green wavelength spectrum, a blue device configured to selectively absorb light in a blue wavelength spectrum, and a red device configured to selectively absorb light in a red wavelength spectrum.

The image sensor 600 according to some example embodiments includes a semiconductor substrate 110, a lower insulation layer 160, an intermediate insulation layer 65, an upper insulation layer 80, a first device 100a, a second device 100b, and a third device 100c.

The semiconductor substrate 110 may be a silicon substrate, and is integrated with the transmission transistor (not shown) and the charge storages 155a, 155b, and 155c.

A metal wire (not shown) and a pad (not shown) are formed on the semiconductor substrate 110, and the lower insulation layer 160 is formed on the metal wire and the pad.

The first device 100a, the second device 100b, and the third device 100c are sequentially formed on the lower insulation layer 160.

The first device 100a, the second device 100b, and the third device 100c may independently be one of the devices 100 shown in FIG. 1, 3, 5, 7, or 9. The device 100 may be a photoelectric conversion device. The specific description thereof is the same as described above. The anode 10 or cathode 20 of the device 100 may be connected to the charge storages 155a, 155b, and 155c.

The active layer 30 of the first device 100a may be a photoelectric conversion device configured to selectively absorb light of any wavelength spectrum of red, blue, and green to photoelectrically convert the light. In some example embodiments, the first device 100a may be a red photoelectric conversion device. The anode 10 or the cathode 20 of the first device 100a may be electrically connected to the first charge storage 155a.

The intermediate insulation layer 65 is formed on the first device 100a.

The second device 100b is formed on the intermediate insulation layer 65.

The active layer 30 of the second device 100b may be a photoelectric conversion device configured to selectively absorb light of any wavelength spectrum of red, blue, and green to photoelectrically convert the light. In some example embodiments, the second device 100b may be a blue photoelectric conversion device. The anode 10 or the cathode 20 of the second device 100b may be electrically connected to the second charge storage 155b.

The upper insulation layer 80 is formed on the second device 100b. The lower insulation layer 160, the intermediate insulation layer 65, and the upper insulation layer 80 have a plurality of through-holes that reveal charge storages 155a, 155b, and 155c.

The third device 100c is formed on the upper insulation layer 80. The active layer 30 of the third device 100c may be a photoelectric conversion device configured to selectively absorb light of any wavelength spectrum of red, blue, and green to photoelectrically convert the light. In some example embodiments, the second device 100b may be a green photoelectric conversion device. The anode 10 or the cathode 20 of the third device 100c may be electrically connected to the third charge storage 155c.

Focusing lens (not shown) may be further formed on the third device 100c. The focusing lens may control a direction of incident light and gather the light in one region. The focusing lens may have a shape of, in some example embodiments, a cylinder or a hemisphere, but is not limited thereto.

Although the drawing illustrates a structure in which the first device 100a, the second device 100b, and the third device 100c are sequentially stacked, the present disclosure is not limited thereto and the stacking order may be variously changed.

As described above, since the first device 100a, the second device 100b, and the third device 100c, which absorb light of different wavelength spectrums, have a stacked structure, a size of the image sensor may be further reduced to realize a down-sized image sensor.

The above-described device and image sensor are each applicable to various electronic devices, but may be applied to example mobile phones, digital cameras, etc., but is not limited thereto.

Figure 26:
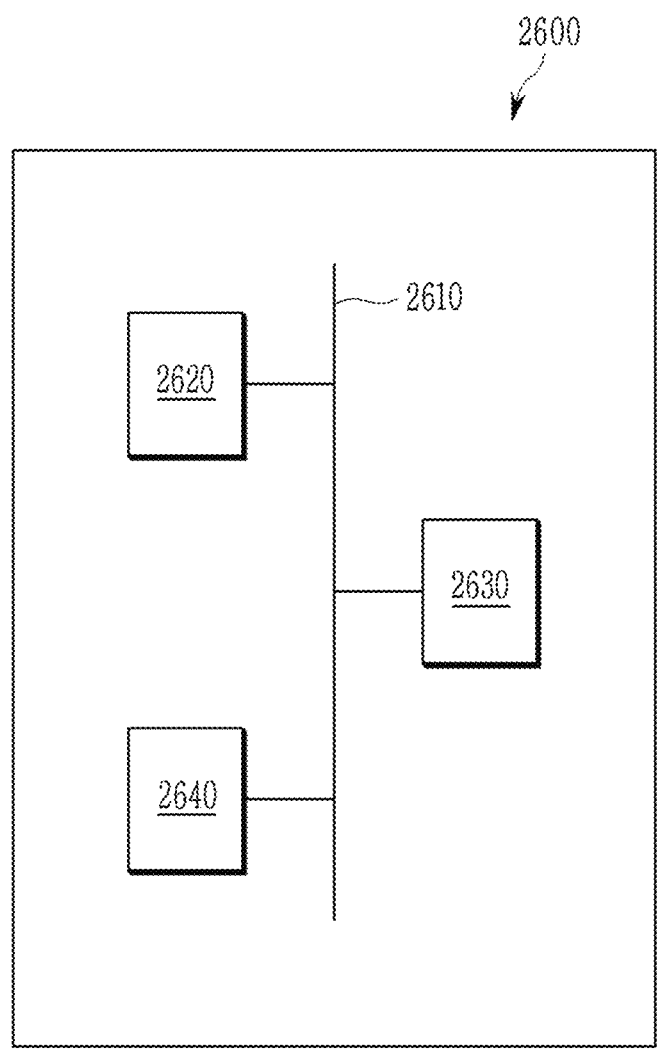
FIG. 26 is a schematic diagram of an electronic device according to some example embodiments.

FIG. 26 is a schematic diagram of an electronic device according to some example embodiments.

Referring to FIG. 26, an electronic device 2600 includes a processor 2620, a memory 2630, and a device 2640 electrically connected through a bus 2610. The device 2640 may include any of the aforementioned various devices 100 and/or sensors 300-600 according to any of the example embodiments. The memory 2630, which may be a non-transitory computer readable medium, may store a program of instructions. The processor 2620 may perform a memory program and thus at least one function, including controlling the device 2640. The processor 2620 may execute the stored program of instructions to perform one or more functions. For example, the processor 2620 may be configured to process electric signals generated by the device 2640.

Hereinafter, some example embodiments are illustrated in more detail with reference to the following examples. However, the present scope is not limited to the following examples.

Manufacture of Device I

Example 1

ITO is sputtered on a glass substrate to form a 150 nm-thick anode (WF: 4.9 eV). On the anode, a compound represented by Chemical Formula A-1 is deposited on the anode to form a 2.5 nm-thick lower auxiliary layer (HOMO: 5.10 eV), and a compound represented by Chemical Formula A-2 is deposited on the lower auxiliary layer to form a 2.5 nm-thick upper auxiliary layer (HOMO: 5.31 eV). Then, a p-type semiconductor represented by Chemical Formula B (λmax: 545 nm) and an n-type semiconductor, fullerene C60 are co-deposited in a volume ratio of 1:1 on the upper auxiliary layer to form a 100 nm-thick photoelectric conversion layer (HOMO: 5.55 eV). Then, Yb is thermally evaporated on the photoelectric conversion layer to form a 1.5 nm-thick electron buffer layer (WF: 2.6 eV). Then, ITO is sputtered on the electron buffer layer to form a 7 nm-thick cathode (WF: 4.7 eV). Then, aluminum oxide ($Al_2O_3$) is deposited on the cathode to form a 50 nm-thick anti-reflective layer and then, sealed with a glass plate to manufacture a device.

[Chemical Formula A-1]

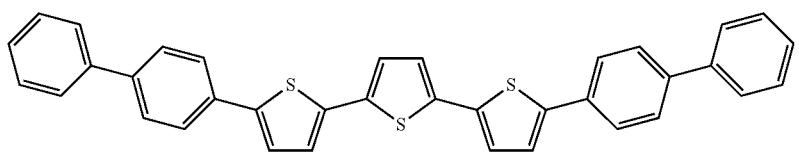

[Chemical Formula A-2]

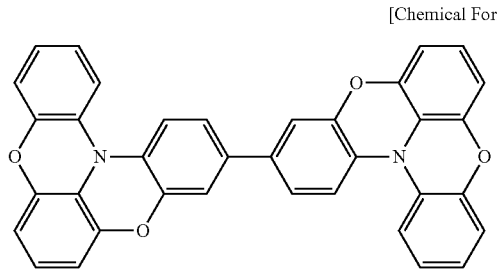

[Chemical Formula B]

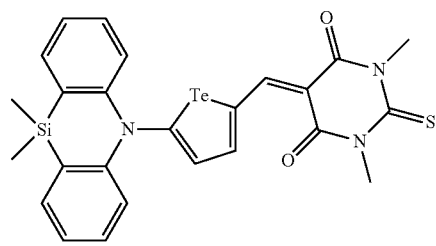

Comparative Example 1

A device is manufactured according to the same method as Example 1 except that a compound represented by Chemical Formula A-3 is deposited to form a single 5 nm-thick auxiliary layer (HOMO: 5.73 eV), instead of the lower and upper auxiliary layers.

[Chemical Formula A-3]

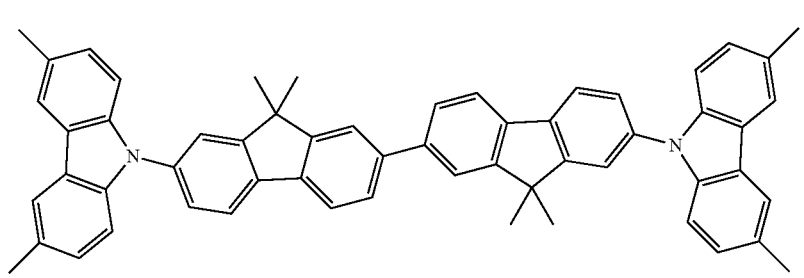

Comparative Example 2

A device is manufactured according to the same method as Example 1 except that a compound represented by Chemical Formula A-4 is deposited to form a 2.5 nm-thick upper auxiliary layer (HOMO: 5.43 eV), instead of the compound represented by Chemical Formula A-2.

[Chemical Formula A-4]

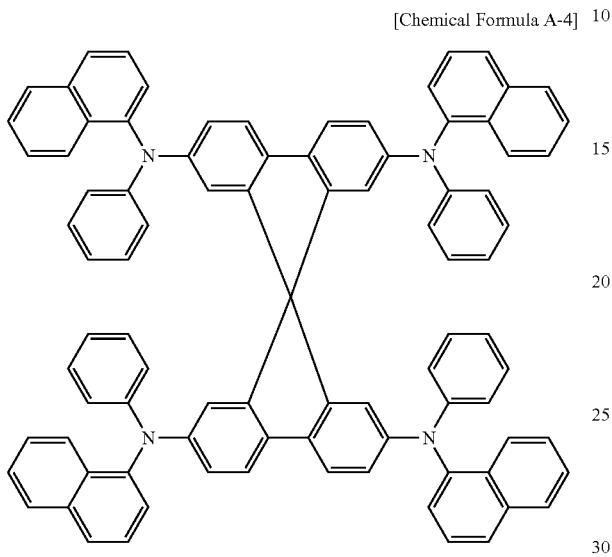

Comparative Example 3

A device is manufactured according to the same method as Example 1 except that a compound represented by Chemical Formula A-5 is deposited to form a 2.5 nm-thick upper auxiliary layer (HOMO: 5.22 eV), instead of the compound represented by Chemical Formula A-2.

[Chemical Formula A-5]

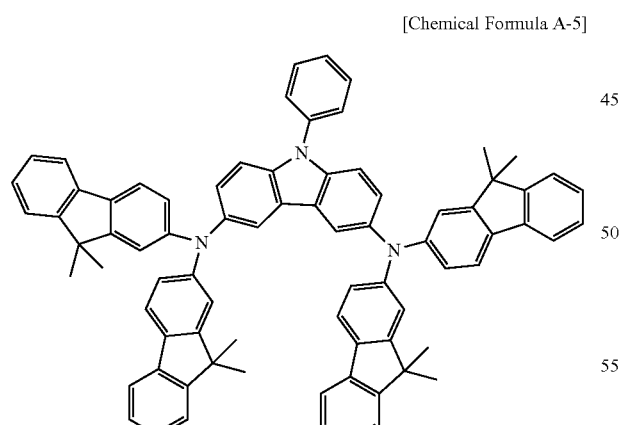

Comparative Example 4

A device is manufactured according to the same method as Example 1 except that a compound represented by Chemical Formula A-6 is deposited to form a 2.5 nm-thick upper auxiliary layer (HOMO: 5.50 eV), instead of the compound represented by Chemical Formula A-2.

[Chemical Formula A-6]

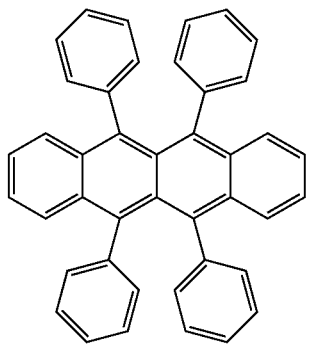

Comparative Example 5

A device is manufactured according to the same method as Example 1 except that a compound represented by Chemical Formula A-7 is deposited to form a 2.5 nm-thick lower auxiliary layer (HOMO: 5.00 eV), instead of the compound represented by Chemical Formula A-2, and a compound represented by Chemical Formula A-6 is deposited to form a 2.5 nm-thick upper auxiliary layer (HOMO: 5.50 eV), instead of the compound represented by Chemical Formula A-2.

[Chemical Formula A-7]

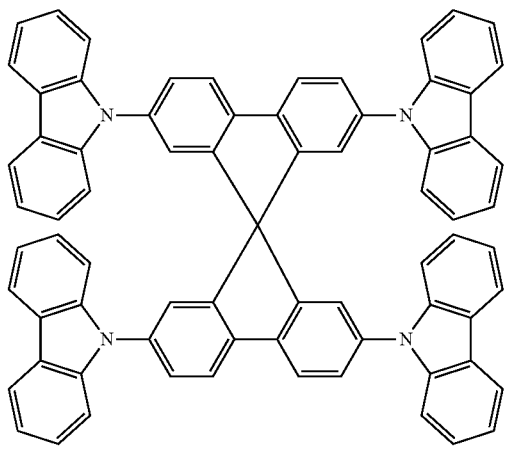

Manufacture of Device II

Example 2

A device is manufactured according to the same method as Example 1 except that a 5 nm-thick upper auxiliary layer is formed instead of the 2.5 nm-thick upper auxiliary layer.

Comparative Example 6

A device is manufactured according to the same method as Comparative Example 2 except that a 5 nm-thick upper auxiliary layer is formed instead of the 2.5 nm-thick upper auxiliary layer.

Comparative Example 7

A device is manufactured according to the same method as Comparative Example 4 except that a 5 nm-thick upper auxiliary layer is formed instead of the 2.5 nm-thick upper auxiliary layer.

Comparative Example 8

A device is manufactured according to the same method as Comparative Example 4 except that a compound represented by Chemical Formula A-3, instead of the compound represented by Chemical Formula A-1, is deposited to form a 5 nm-thick lower auxiliary layer (HOMO: 5.73 eV), and a compound represented by Chemical Formula A-1, instead of the compound represented by Chemical Formula A-2, is deposited to form a 2.5 nm-thick upper auxiliary layer (HOMO: 5.10 eV).

Evaluation I

Energy barriers of the devices according to Examples and Comparative Examples are shown in Table 1 and FIGS. 17 to 23.

Figure 17:
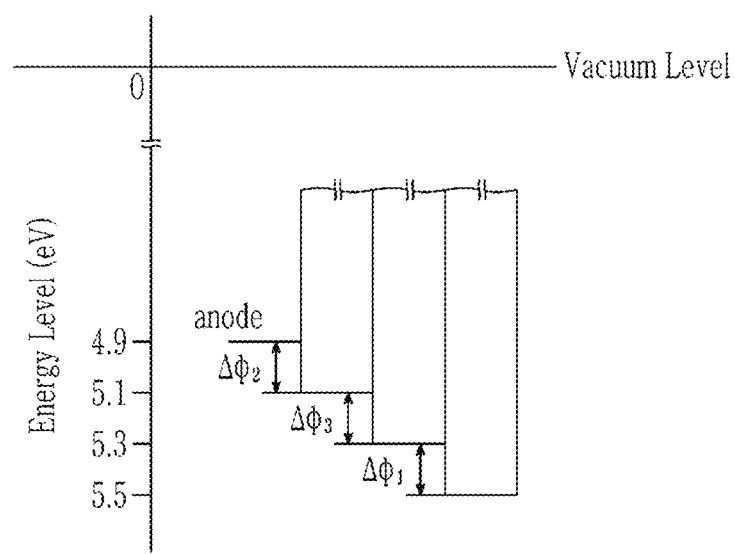
FIG. 17 is an energy diagram showing the energy levels from the anode to the active layer of one or more devices according to Examples 1 and 2.
Figure 18:
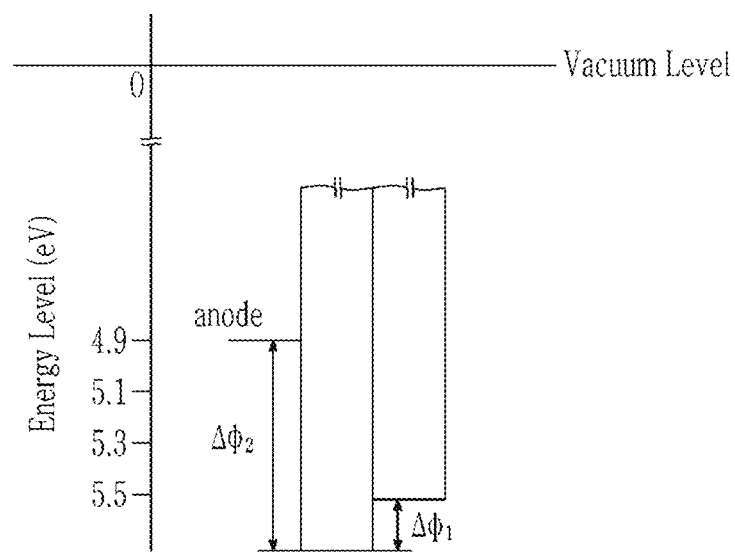
FIG. 18 is a diagram showing the energy levels from the anode to the active layer of one or more devices according to Comparative Example 1.
Figure 19:
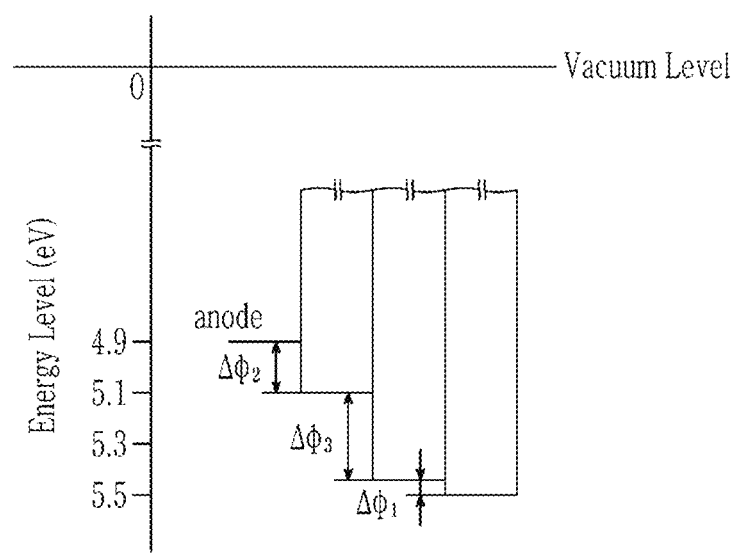
FIG. 19 is a diagram showing the energy levels from the anode to the active layer of one or more devices according to Comparative Examples 2 and 6.
Figure 20:
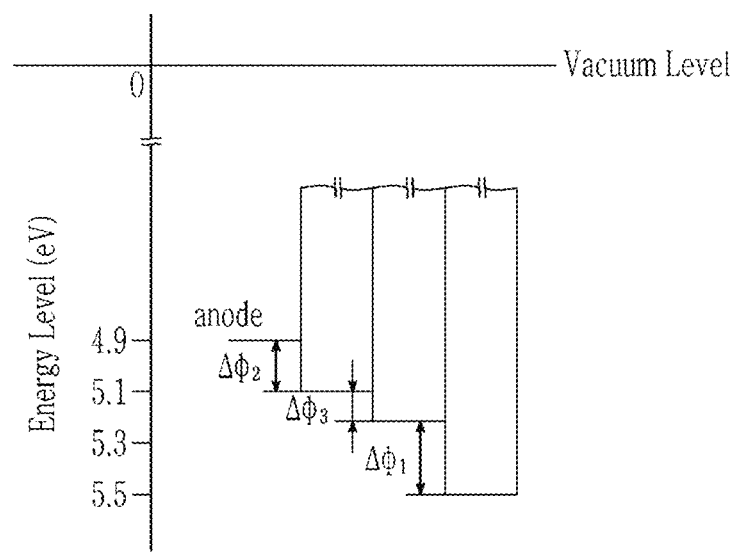
FIG. 20 is a diagram showing the energy levels from the anode to the active layer of one or more devices according to Comparative Example 3.
Figure 21:
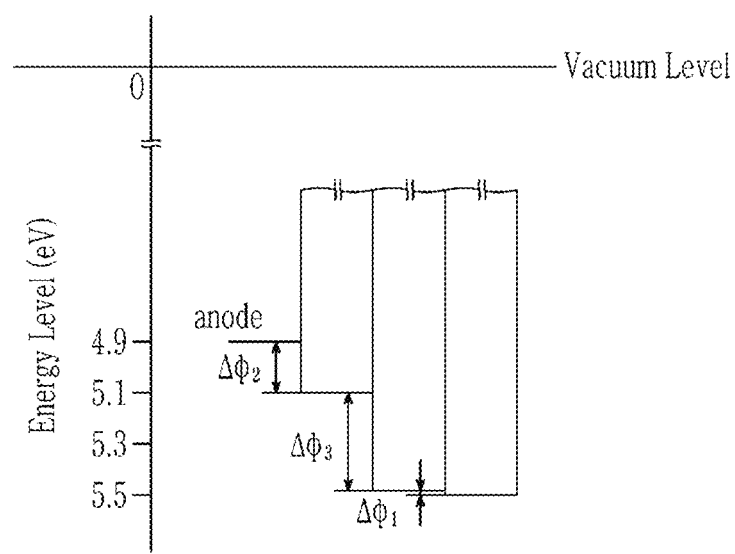
FIG. 21 is a diagram showing the energy levels from the anode to the active layer of one or more devices according to Comparative Examples 4 and 7.
Figure 22:
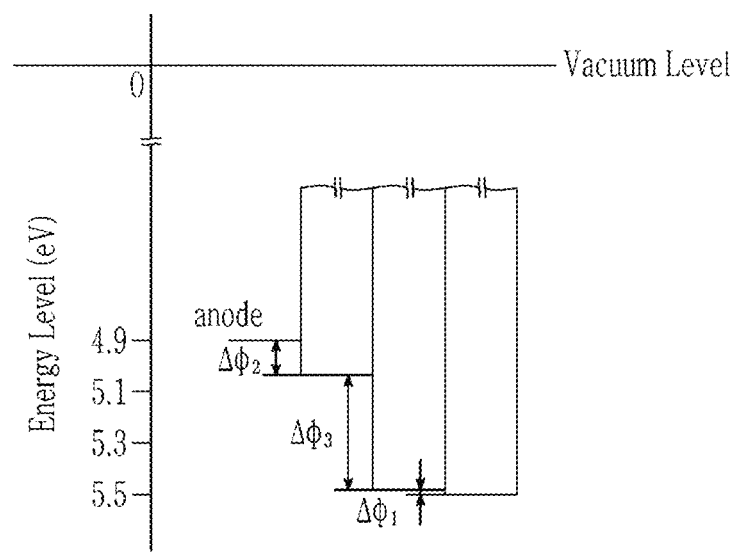
FIG. 22 is a diagram showing the energy levels from the anode to the active layer of one or more devices according to Comparative Example 5.
Figure 23:
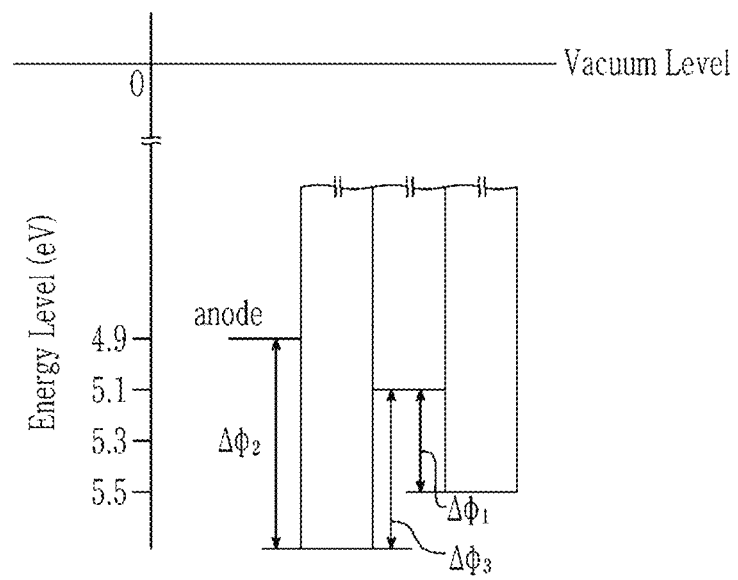
FIG. 23 is a diagram showing the energy levels from the anode to the active layer of one or more devices according to Comparative Example 8.

FIG. 17 is an energy diagram showing the energy levels from the anode to the active layer of the device according to Examples 1 and 2, FIG. 18 is a diagram showing the energy levels from the anode to the active layer of the device according to Comparative Example 1, FIG. 19 is a diagram showing the energy levels from the anode to the active layer of the device according to Comparative Examples 2 and 6, FIG. 20 is a diagram showing the energy levels from the anode to the active layer of the device according to Comparative Example 3, FIG. 21 is a diagram showing the energy levels from the anode to the active layer of the device according to Comparative Examples 4 and 7, FIG. 22 is a diagram showing the energy levels from the anode to the active layer of the device according to Comparative Example 5, and FIG. 23 is a diagram showing the energy levels from the anode to the active layer of the device according to Comparative Example 8.

TABLE 1

|  | $\Delta\Phi_1$ (eV) | $\Delta\Phi_2$ (eV) | $\Delta\Phi_3$ (eV) |
| --- | --- | --- | --- |
| Example 1, 2 | 0.24 | 0.20 | 0.21 |
| Comparative Example 1 | 0.18 | 0.83 | — |
| Comparative Example 2, 6 | 0.12 | 0.20 | 0.33 |
| Comparative Example 3 | 0.33 | 0.20 | 0.12 |
| Comparative Example 4, 7 | 0.05 | 0.20 | 0.40 |
| Comparative Example 5 | 0.05 | 0.1 | 0.5 |
| Comparative Example 8 | 0.45 | 0.83 | 0.63 |

*$\Delta\Phi_1$: a difference between the HOMO energy level of the active layer and the HOMO energy level of the upper auxiliary layer,
*$\Delta\Phi_2$: a difference between the HOMO energy level of the lower auxiliary layer and the work function of the anode, and
*$\Delta\Phi_3$: a difference between the HOMO energy level of the upper auxiliary layer and the HOMO energy level of the lower auxiliary layer.

Evaluation II

Remaining electron characteristics of the devices according to Examples and Comparative Examples are evaluated.

The remaining electron characteristics are evaluated by measuring an amount of charge carriers which are photoelectrically converted in one frame but not used for a signal treatment and thus read in the following frame and specifically, measuring a current amount measured by $10^{-6}$ second unit with a Keithley 2400 equipment after irradiating the devices according to Examples and Comparative Examples with photoelectrically-convertible light of a green wavelength spectrum for a particular (or, alternatively, predetermined) time and then, turning it off. The remaining electron amount is measured by h+/s/$\mu m^2$ unit at 5000 lux, and when the remaining electron amounts of the devices of Examples 1 and 2 are respectively regarded as "100" (reference), the remaining electron amounts of the devices according to Comparative Examples are relatively evaluated.

The remaining electron characteristics of Examples and Comparative Examples including an auxiliary layer having a total thickness (T) of 5 nm are shown in Table 2, and the remaining electron characteristics of Examples and Comparative Examples including an auxiliary layer having a total thickness (T) of 7.5 nm are shown in Table 3.

TABLE 2

| T: 5 nm | Remaining electron relative value |
| --- | --- |
| Example 1 | 100 (ref.) |
| Comparative Example 1 | 447 |
| Comparative Example 2 | 143 |
| Comparative Example 3 | 188 |
| Comparative Example 4 | 234 |
| Comparative Example 5 | 514 |

TABLE 3

| T: 7.5 nm | Remaining electron relative value |
| --- | --- |
| Example 2 | 100 (ref.) |
| Comparative Example 6 | 184 |
| Comparative Example 7 | 192 |
| Comparative Example 8 | 304 |

Referring to Tables 2 and 3, the devices according to Examples exhibit improved remaining electron characteristics compared with the devices according to Comparative Examples.

Evaluation III

Photoelectric conversion efficiency of the photoelectric conversion devices according to Examples and Comparative Examples is evaluated.

The photoelectric conversion efficiency (EQE) is evaluated in a wavelength spectrum of 400 nm to 720 nm by using an Incident Photon to Current Efficiency (IPCE) method.

Figure 24:
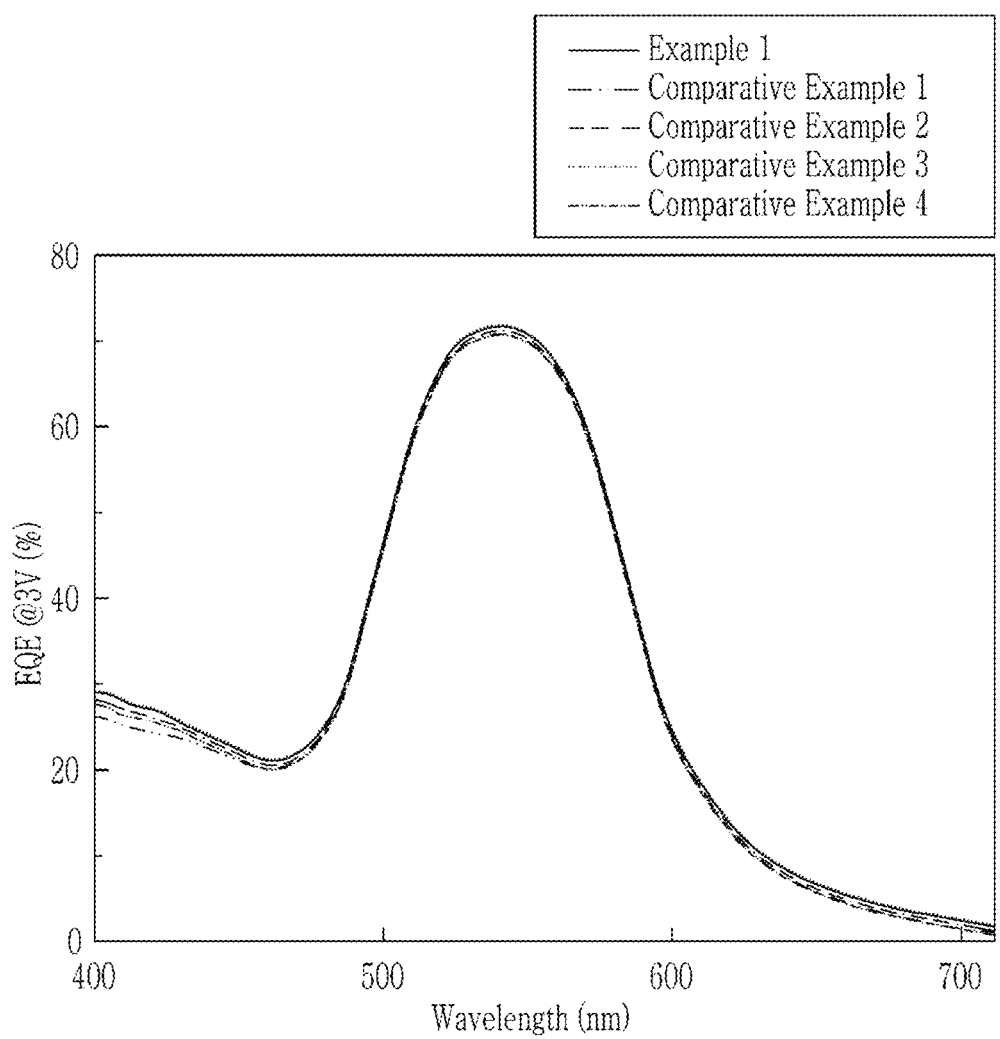
FIG. 24 is a graph showing photoelectric conversion efficiency of one or more devices according to Example 1 and Comparative Examples 1 to 4.
Figure 25:
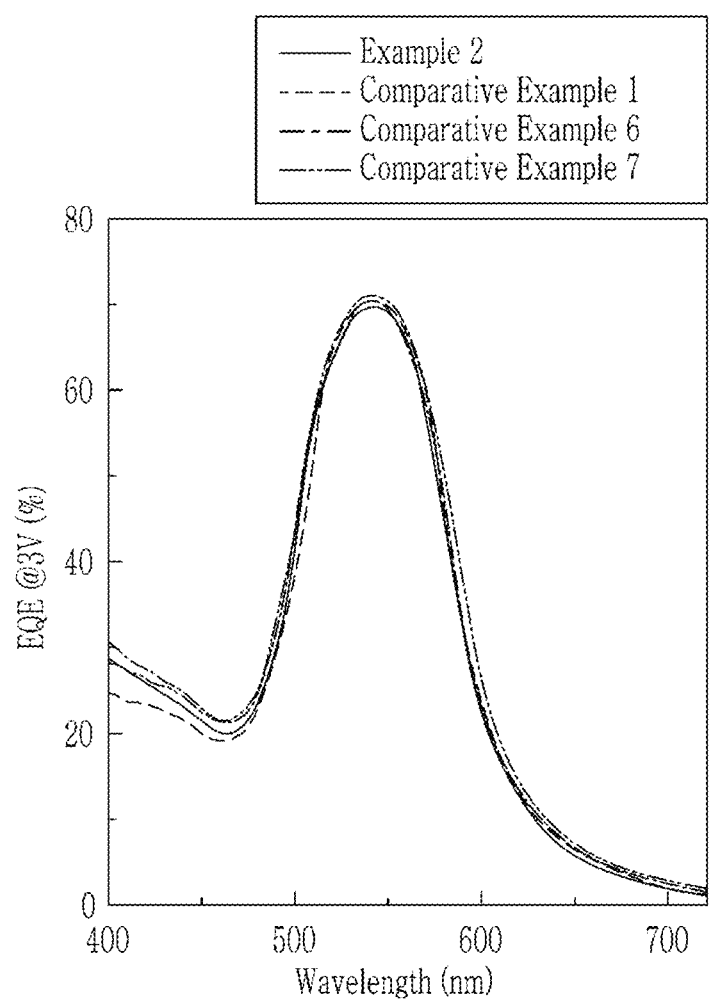
FIG. 25 is a graph showing photoelectric conversion efficiency of one or more devices according to Example 2 and Comparative Examples 1, 6, and 7.

FIG. 24 is a graph showing photoelectric conversion efficiency of the devices according to Example 1 and Comparative Examples 1 to 4, and FIG. 25 is a graph showing photoelectric conversion efficiency of the devices according to Example 2 and Comparative Examples 1, 6, and 7.

Referring to FIGS. 24 and 25, the devices according to Examples exhibit equivalent or improved photoelectric conversion efficiency compared with the devices according to Comparative Examples. In addition, the photoelectric conversion efficiency is not deteriorated depending on a thickness of the auxiliary layer.

While this disclosure has been described in connection with what is presently considered to be practical example embodiments, it is to be understood that the inventive concepts are not limited to said example embodiments. On the contrary, it is intended to cover various modifications and equivalent arrangements included within the spirit and scope of the appended claims.

What is claimed is:
1. A device, comprising:
a first electrode and a second electrode;
an active layer between the first electrode and the second electrode; and
a plurality of auxiliary layers between the first electrode and the active layer, wherein the plurality of auxiliary layers includes a first auxiliary layer and a second auxiliary layer, the first auxiliary layer proximate to the active layer in relation to the second auxiliary layer, the second auxiliary layer proximate to the first electrode in relation to the first auxiliary layer, wherein
the first electrode has a work function,
the active layer, the first auxiliary layer, and the second auxiliary layer have respective energy levels that are respective highest occupied molecular orbital (HOMO) energy levels of the active layer, the first auxiliary layer, and the second auxiliary layer, or respective lowest unoccupied molecular orbital (LUMO) energy levels of the active layer, the first auxiliary layer, and the second auxiliary layer, and
the work function of the first electrode and the respective energy levels of the active layer, first auxiliary layer, and the second auxiliary layer are each measured by photoelectron spectroscopy, wherein the energy level of the active layer, the energy level of the first auxiliary layer, the energy level of the second auxiliary layer, and the work function of the first electrode have different magnitudes from each other and at least partially define a sequentially-changing energy level through the device, such that
a magnitude of the energy level of the first auxiliary layer is between a magnitude of the energy level of the active layer and a magnitude of the energy level of the second auxiliary layer, and
the magnitude of the energy level of the second auxiliary layer is between the magnitude of the energy level of the first auxiliary layer and a magnitude of the work function of the first electrode, and wherein the active layer, the first auxiliary layer, the second auxiliary layer, and the first electrode satisfy Relationship Equation 1:

$|\Delta\Phi_1 - \Delta\Phi_2| \leq 0.1$ eV  [Relationship Equation 1]

wherein, in Relationship Equation 1,
$\Delta\Phi_1$ is an energy barrier between the active layer and the first auxiliary layer that is a difference between the energy level of the active layer and the energy level of the first auxiliary layer, and
$\Delta\Phi_2$ is an energy barrier between the second auxiliary layer and the first electrode that is a difference between the energy level of the second auxiliary layer and the work function of the first electrode.

2. The device of claim 1, wherein
the first auxiliary layer is in contact with the active layer, and
the second auxiliary layer is in contact with the first electrode.

3. The device of claim 1, wherein
the active layer, the first auxiliary layer, the second auxiliary layer, and the first electrode satisfy Relationship Equations 2 and 3:

$|\Delta\Phi_1 - \Delta\Phi_3| \leq 0.1$ eV  [Relationship Equation 2]

$|\Delta\Phi_3 - \Delta\Phi_2| \leq 0.1$ eV  [Relationship Equation 3]

wherein, in Relationship Equations 2 and 3,
$\Delta\Phi_1$ is the energy barrier between the active layer and the first auxiliary layer that is the difference between the energy level of the active layer and the energy level of the first auxiliary layer,
$\Delta\Phi_2$ is the energy barrier between the second auxiliary layer and the first electrode that is the difference between the energy level of the second auxiliary layer and the work function of the first electrode, and
$\Delta\Phi_3$ is an energy barrier between the first auxiliary layer and the second auxiliary layer that is a difference between the energy level of the first auxiliary layer and the energy level of the second auxiliary layer.

4. The device of claim 3, wherein each of $\Delta\Phi_1$, $\Delta\Phi_2$, and $\Delta\Phi_3$ is less than or equal to about 0.5 eV.

5. The device of claim 3, wherein the active layer, the first auxiliary layer, the second auxiliary layer, and the first electrode satisfy Relationship Equations 1E, 2E, and 3E,

[Relationship Equation 1E]
the magnitude of the energy level of the first auxiliary layer is between the magnitude of the energy level of the active layer and a magnitude of the energy level of the third auxiliary layer,
the magnitude of the energy level of the third auxiliary layer is between the magnitude of the energy level of the first auxiliary layer and the magnitude of the energy level of the second auxiliary layer, and
the magnitude of the energy level of the second auxiliary layer is between the magnitude of the energy level of the third auxiliary layer and the magnitude of the work function of the first electrode, and the active layer, the first auxiliary layer, the third auxiliary layer, the second auxiliary layer, and the first electrode satisfy Relationship Equations 4 and 5:

$|\Delta\Phi_2 - \Delta\Phi_4| \leq 0.1$ eV  [Relationship Equation 4]

$|\Delta\Phi_1 - \Delta\Phi_5| \leq 0.1$ eV  [Relationship Equation 5]

wherein, in Relationship Equations 4 and 5,
$\Delta\Phi_1$ is the energy barrier between the active layer and the first auxiliary layer that is the difference between the energy level of the active layer and the energy level of the first auxiliary layer,
$\Delta\Phi_2$ is the energy barrier between the second auxiliary layer and the first electrode that is the difference between the energy level of the second auxiliary layer and the energy level of the first electrode, $0 < |\Delta\Phi_1 - \Delta\Phi_2| \leq 0.05$ eV $0 < |\Delta\Phi_1 - \Delta\Phi_3| \leq 0.05$ eV  [Relationship Equation 2E]

$0 < |\Delta\Phi_3 - \Delta\Phi_2| \leq 0.05$ eV  [Relationship Equation 3E]

wherein, in Relationship Equation 1E to 3E,
$\Delta\Phi_1$ is the energy barrier between the active layer and the first auxiliary layer that is the difference between the energy level of the active layer and the energy level of the first auxiliary layer,
$\Delta\Phi_2$ is the energy barrier between the second auxiliary layer and the first electrode that is the difference between the energy level of the second auxiliary layer and the work function of the first electrode, and
$\Delta\Phi_3$ is the energy barrier between the first auxiliary layer and the second auxiliary layer that is the difference between the energy level of the first auxiliary layer and the energy level of the second auxiliary layer.

6. The device of claim 1, wherein
the plurality of auxiliary layers further includes a third auxiliary layer between the first auxiliary layer and the second auxiliary layer, the energy level of the active layer, the energy level of the first auxiliary layer, an energy level of the third auxiliary layer, the energy level of the second auxiliary layer, and the work function of the first electrode have different magnitudes from each other and at least partially define the sequentially-changing energy level through the device, such that $\Delta\Phi_4$ is an energy barrier between the third auxiliary layer and the second auxiliary layer that is a difference between the energy level of the third auxiliary layer and the energy level of the second auxiliary layer, and $\Delta\Phi_5$ is an energy barrier between the first auxiliary layer and the third auxiliary layer that is a difference between the energy level of the first auxiliary layer and the energy level of the third auxiliary layer.

7. The device of claim 6, wherein the energy levels of the active layer, the first auxiliary layer, the third auxiliary layer, the second auxiliary layer, and the first electrode satisfy Relationship Equation 6:

$$|\Delta\Phi_4-\Delta\Phi_5|\leq 0.1 \text{ eV}. \qquad \text{[Relationship Equation 6]}$$

wherein, in Relationship Equation 6, $\Delta\Phi_4$ is the energy barrier between the third auxiliary layer and the second auxiliary layer that is a difference between the energy level of the third auxiliary layer and the energy level of the second auxiliary layer, and $\Delta\Phi_5$ is the energy barrier between the first auxiliary layer and the third auxiliary layer that is a difference between the energy level of the first auxiliary layer and the energy level of the third auxiliary layer.

8. The device of claim 6, wherein $\Delta\Phi_1$, $\Delta\Phi_2$, $\Delta\Phi_4$ and $\Delta\Phi_5$ are each less than or equal to about 0.5 eV.

9. The device of claim 1, wherein
the first electrode is an anode and the second electrode is a cathode, and
each energy barrier is a difference between HOMO energy levels.

10. The device of claim 9, further comprising:
an electron buffer layer between the second electrode and the active layer.

11. The device of claim 10, wherein the electron buffer layer includes a lanthanide element, calcium (Ca), potassium (K), aluminum (Al), or an alloy thereof.

12. The device of claim 10, wherein
the electron buffer layer includes
a first electron buffer layer and a second electron buffer layer, the first electron buffer layer proximate to the active layer in relation to the second electron buffer layer, the second electron buffer layer proximate to the second electrode in relation to the first electron buffer layer,
a LUMO energy level of the active layer, a LUMO energy level of the first electron buffer layer, a LUMO energy level of the second electron buffer layer, and a work function of the second electrode have different magnitudes from each other and at least partially define the sequentially-changing energy level through the device, such that
a magnitude of the LUMO energy level of the first electron buffer layer is between a magnitude of the LUMO energy level of the active layer and a magnitude of the LUMO energy level of the second electron buffer layer, and the magnitude of the LUMO energy level of the second electron buffer layer is between the magnitude of the LUMO energy level of the first electron buffer layer and a magnitude of the work function of the second electrode, and the active layer, the first electron buffer layer, the second electron buffer layer, and the second electrode satisfy Relationship Equation 7:

$$|\Delta\Phi_6-\Delta\Phi_7|\leq 0.1 \text{ eV} \qquad \text{[Relationship Equation 7]}$$

wherein, in Relationship Equation 7, $\Delta\Phi_6$ is an energy barrier between the active layer and the first electron buffer layer that is a difference between the LUMO energy level of the active layer and the LUMO energy level of the first electron buffer layer, and $\Delta\Phi_7$ is an energy barrier between the second electron buffer layer and the second electrode that is a difference between the LUMO energy level of the second electron buffer layer and the work function of the second electrode, wherein the energy barriers of $\Delta\Phi_6$ and $\Delta\Phi_7$ are differences between LUMO energy levels.

13. The device of claim 12, wherein the active layer, the first electron buffer layer, the second electron buffer layer and the second electrode satisfy Relationship Equations 8 and 9:

$$|\Delta\Phi_6-\Delta\Phi_8|\leq 0.1 \text{ eV} \qquad \text{[Relationship Equation 8]}$$

$$|\Delta\Phi_7-\Delta\Phi_8|\leq 0.1 \text{ eV} \qquad \text{[Relationship Equation 9]}$$

wherein in Relationship Equations 8 and 9, $\Delta\Phi_6$ is the energy barrier between the active layer and the first electron buffer layer that is the difference between the LUMO energy level of the active layer and the LUMO energy level of the first electron buffer layer, $\Delta\Phi_7$ is the energy barrier between the second electron buffer layer and the second electrode that is the difference between the LUMO energy level of the second electron buffer layer and the work function of the second electrode, and $\Delta\Phi_8$ is an energy barrier between the first electron buffer layer and the second electron buffer layer that is a difference between the LUMO energy level of the first electron buffer layer and the LUMO energy level of the second electron buffer layer, wherein the energy barriers of $\Delta\Phi_6$, $\Delta\Phi_7$, and $\Delta\Phi_8$ are differences between LUMO energy levels.

14. The device of claim 13, wherein the $\Delta\Phi_6$, $\Delta\Phi_7$, and $\Delta\Phi_8$ are each less than or equal to about 0.5 eV.

15. The device of claim 1, wherein
the first electrode is a cathode,
the second electrode is an anode, and
the energy barrier is a difference between LUMO energy levels.

16. The device of claim 15, further comprising:
a hole buffer layer between the second electrode and the active layer.

17. The device of claim 1, wherein the first auxiliary layer and the second auxiliary layer each have a thickness of less than or equal to about 10 nm.

18. The device of claim 1, wherein the first auxiliary layer and the second auxiliary layer each include an organic material.

19. The device of claim 1, wherein the active layer is a photoelectric conversion layer configured to absorb light in at least part of a wavelength spectrum and convert the absorbed light into an electrical signal.

20. A sensor comprising the device of claim 1.

21. An electronic device comprising the device of claim 1.

22. An electronic device comprising the sensor of claim 20.

\* \* \* \* \*